United States Patent [19]

Ong et al.

[11] 4,446,365
[45] May 1, 1984

[54] ELECTROSTATIC IMAGING METHOD

[75] Inventors: Poen S. Ong; Alfonso Zermeno; Lee M. Marsh, Jr., all of Houston, Tex.; James M. Hevezi, Tuscon, S. Dak.

[73] Assignee: University of Texas System, Austin, Tex.

[21] Appl. No.: 280,401

[22] Filed: Jul. 6, 1981

Related U.S. Application Data

[60] Division of Ser. No. 22,989, Mar. 22, 1979, abandoned, which is a continuation-in-part of Ser. No. 781,165, Mar. 25, 1977, abandoned.

[51] Int. Cl.³ .............................................. H01J 31/50
[52] U.S. Cl. .................................. 250/213 R; 378/32
[58] Field of Search ............. 250/213 R, 370; 378/28, 378/29, 30, 31, 32, 33

[56] References Cited

U.S. PATENT DOCUMENTS 2,833,930 5/1958 Walkup .............................. 250/49.5
3,000,735 9/1961 Gunning et al. ......................... 96/1

Primary Examiner—David C. Nelms
Attorney, Agent, or Firm—Dula, Shields & Egbert

[57] ABSTRACT

A method of operating a photodetector system. The method impresses a surface charge on a photon detector by establishing an electric potential across the detector, storing the detector in the dark, disconnecting the source of electric potential, and electrically connecting layers in the detector.

3 Claims, 28 Drawing Figures

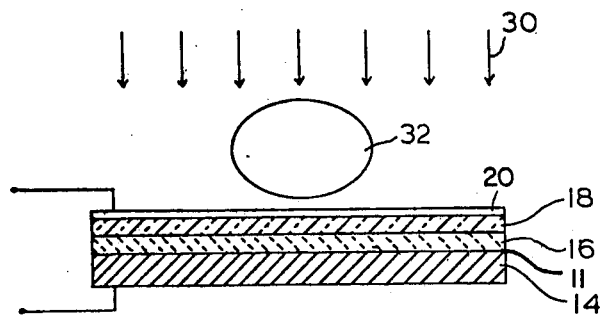
FIG. 4
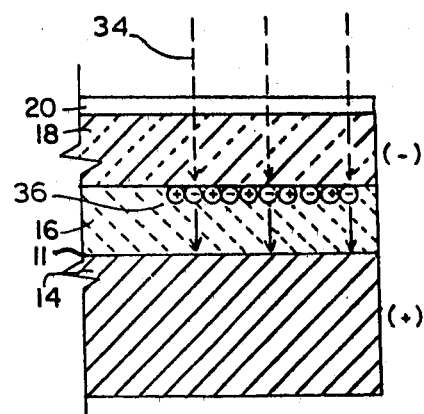
FIG. 5
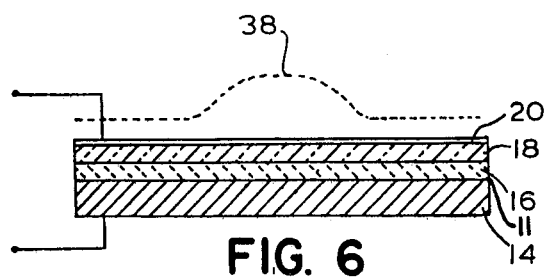
FIG. 6
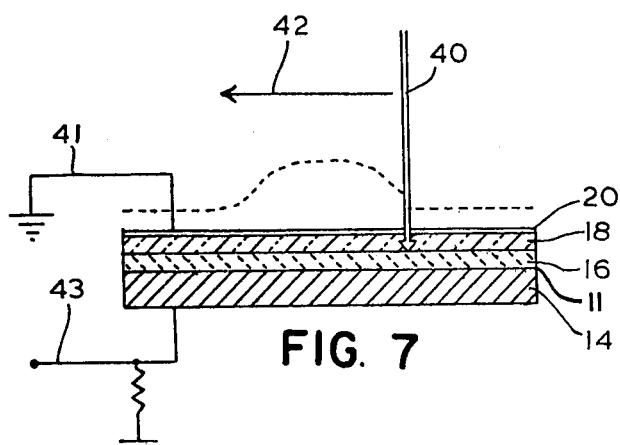
FIG. 7
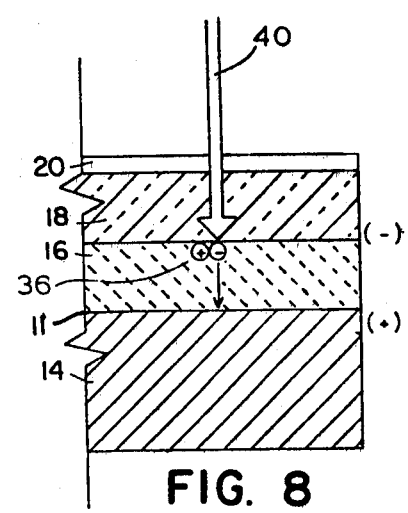
FIG. 8
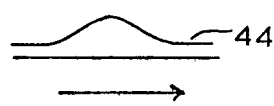

FIG. 19
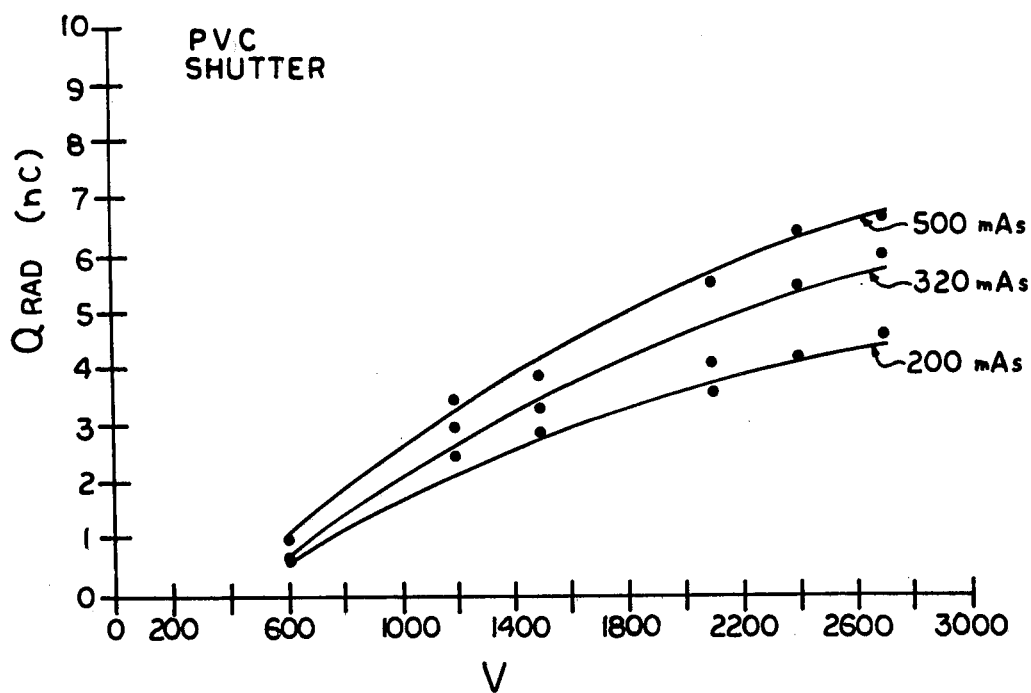
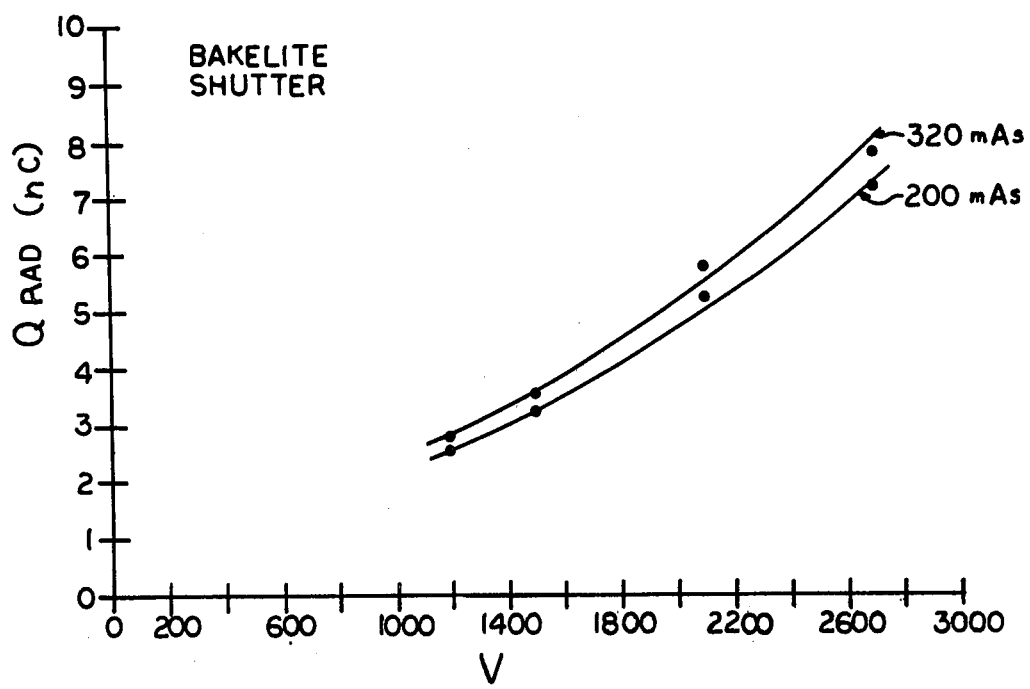

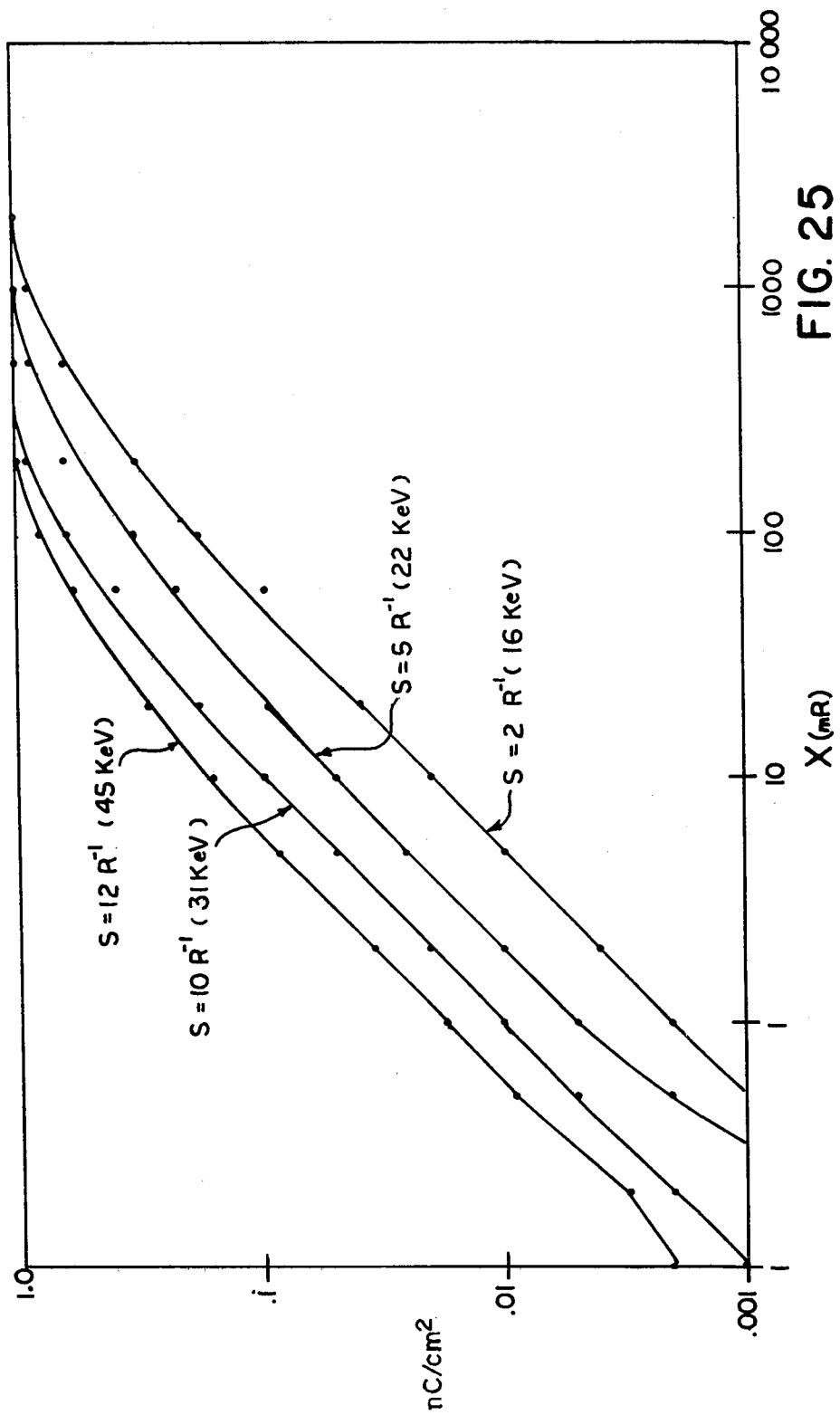

ELECTROSTATIC IMAGING METHOD

RELATED APPLICATIONS

This application is a division of application Ser. No. 022,989, filed Mar. 22, 1979, abandoned, which is a continuation-in-part of Ser. No. 781,165, filed Mar. 25, 1977, now abandoned.

BACKGROUND OF THE INVENTION

1. Field of the Invention

The present invention relates generally to methods of operating a photodetector system used to obtain radiographic information from modulation of a uniform X-ray flux by a test object or patient. More specifically, the present invention relates to methods impress a surface charge on a photon detector and produce a latent image in a photoconductor.

2. Background of the Prior Art a. Facsimile and Vidicons

Facsimile systems modulate an electrical signal in response to light that is reflected from a small portion of an image. Facsimile requires production of a real image.

Vidicon tubes store a latent image as a charge distribution pattern in a semiconductor target. This latent image is scanned by an electron beam and the current variation induced by the different charges on separate portions of the target comprises a video signal. Vidicons require use of a high vacuum and precise focusing of an electron beam that must be shielded from external electric and magnetic fields.

b. Conventional Radiographic Methods

Latent images stored in silver halide film or selenium xeroradiographic plates must be chemically or powder cloud developed to produce real images. Use of calcium tungstate crystals or a high atomic weight gas for image intensification degrades image quality and still requires exposures of from 1 to 5 R per typical clinical mammogram. Powder cloud development of latent xeroradiographic images requires high differential charge densities on the xeroradiographic plate to attract and hold powder particles prior to fusing. This high charge differential is generated by x-rays, or ions, impinging on the surface of a charged selenium plate. The higher the differential charge needed to produce an image, the more X-ray exposure is required.

The reader is directed to the following publications for detailed discussion of this prior art.

XERORADIOGRAPHY, J. W. Boag, *Phys. Med. Biol.*, 1973, Vol. 18, No. 1, pp. 3–37; *Principals of Radiographic Exposure and Processing,* Arthur W. Fuchs, 1958, Chapter 14, "X-Ray Intensifying Screens", pp. 158–164.

U.S. Pat. No. 3,860,817; Reducing Patient X-Ray Dose During Fluoroscopy With an Image System.

U.S. Pat. No. 3,828,191, Gas Handling System for Electronradiography Imaging Chamber.

U.S. Pat. No. 3,308,233, Xerographic Facsimile Printer Having Light Beam Scanning and Electrical Charging With Transparent Conductive Belt.

Recent research by the present inventors and others indicates that a detailed latent image can be created in a xeroradiographic plate by very low levels (under 10 mR) of X-ray exposure. At this exposure level latent image is present but, its associated electrostatic field is not of sufficient intensity to produce a real image by the powder cloud method of image development. For details of this research see, Grant Application, "Radiomammography With Less than 150 mR Per Exposure", available from the Department of Experimental Radiology, M.D. Anderson Hospital, Houston, Tex. 77025.

c. Semiconductor Art

The prior art of reading charge storage patterns out of multilayer semiconductor sandwich structure lies largely in the area of electronics, especially exotic computer memories.

Charge patterns on certain MOS structures can be "read out" using a photon beam. See, *Imaging and Storage With a Uniform MOS Structure,* Applied Physics Letters, Vol. 11, Number 11, pp. 359–361. This technology functions by modifying a depletion layer and then charging the layer to saturation. The few micron thick depletion layer is the only active structure.

Electric fields can also be impressed across two separable photoconductive insulating films in pressure contact that are precharged to the same polarity. See, *Increasing the Sensitivity of Xerographic Photoconductors,* IBM Technical Disclosure Bulletin, Vol. 6, No. 10, 1964, page 60.

IBM has also developed an exotic charge storage beam addressable memory comprising a semiconductor sandwich wherein the semiconductor is totally insulated from both electrodes in the sandwich. See, IBM Technical Disclosure Bulletin, Vol. 9, No. 5, 1966, pp. 555–556. This device allows data readout by shifting charge population to one side or the other of the insulated semiconductor.

Finally, some theoretical work has been done on the behavior of light sensitive capacitors, see, *Analysis and Performance of a Light Sensitive Capacitor,* Proceedings of the IEEE, April 1965, p. 378.

d. Objects of the Present Invention

It is an object of the present to provide a method and apparatus capable of replacing conventional radiographic films.

Another purpose of the present invention is to provide an X-ray sensing system whose output is an analog or digital video signal that may be selectively displayed on a television monitor, recorded on film, or directly stored or processed in a computer for image enhancement or pattern recognition.

A further purpose of the present invention is to provide a novel method and apparatus for converting a charge distribution on a semi-conducting surface to a modulated electric signal.

Yet a further purpose of the present invention is to provide a novel low noise method and apparatus for reading out a latent image stored as a pattern of electrical charges by selectively discharging said charges in the presence of a reverse biased electric field.

A final purpose of the present invention is to provide an X-ray sensing system that is capable of directly timing X-ray exposure.

SUMMARY OF THE INVENTION

The present invention is a method of converting a latent radiographic image stored by a photodetector to an electric video signal.

The detector is read out by being raster scanned by a beam of photons. These photons create electron-hole pairs in the photoconductor, which allow a portion of the the photoconductor's surface charge to discharge through an external electric circuit. The signal amplitude in this external circuit at any given time is a function of the intensity of the latent image in the portion of the photoconductor being irradiated with photons at that time, i.e., it is a video signal.

BRIEF DESCRIPTION OF THE DRAWINGS

FIG. 4 illustrates the detector structure of a preferred embodiment of the present invention as it is used in an X-ray system;

FIG. 5 is a greatly enlarged schematic cross-sectional view of a portion of FIG. 4 illustrating the effect of a modulated X-ray flux on the detector;

FIG. 6 is a schematic view of the detector graphically illustrating the change in detector surface charge caused by X-ray exposure;

FIG. 7 is a schematic view of the detector apparatus taught by the present invention being read out by a thin, scanning photon beam, an output wave form of the video electric signal is illustrated together with a schematic representation of the surface charge of the detector;

FIG. 8 is a highly enlarged schematic cross-sectional view of a small portion of the detector structure shown in FIG. 7 illustrating the electron hole production mechanism in the photoconductor layer used by the present invention;

FIG. 14 also shows a plot of specific points representing experimental results from tests run on this experimental detector structure for a given mylar thickness and selenium thickness.

FIG. 19 is a graph that plots the total charge collected by an experimental embodiment of the present invention as a function of applied voltage across its photoconductive layer. FIG. 19 illustrates increase in latitude of the present invention's detector that is observed as applied voltage across the photoconductor is increased;

FIG. 25 is the characteristic curve of the detector structure.

DESCRIPTION OF THE PREFERRED EMBODIMENT

Figure 1:
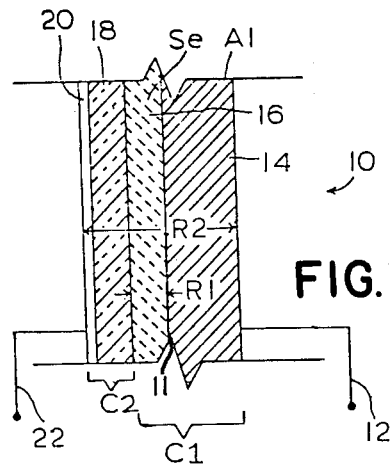
FIG. 1 is a greatly enlarged cross-sectional view of a portion of one embodiment of the multilayered photon detector apparatus taught by the present invention.

In FIG. 1, multilayered photon detector apparatus 10 has first electrode 12 conductively connected to a first conductive layer 14. A photoconductive layer 16 is in physical and electrical contact with plate 14 which may be made of aluminum or any other conductor. An oxide layer 11 may act as a blocking contact between layer 16 and plate 14. Layers 14, 16, 11 may be provided by using a commercial xeroradiographic plate. Transparent insulating layer 18 overlays and may be integrally affixed to selenium photoconductor layer 16. A transparent conductive layer 20 may be integrally affixed to and overlies insulator 18. These layers may be made by vapor deposition or by adhesively bonding the individual components together. Layer 20 is electrically connected to lead 22.

DISCUSSION OF EXPERIMENTAL SYSTEM #1

The experimental plates used to test the present invention as early as March 1976 were made from conventional xeroradiographic plates. These plates are made for mamography by the Xerox Company. To make the present invention's detector, a plate is first cut to the correct size and then covered with mylar. The conductive coating, which is either Nesa glass or a few angstroms of gold, is placed on the mylar.

In the preferred embodiment of the present invention discussed in this section of the specification, the aluminum backing plate 14 is approximately 1/10 of an inch thick and the layer of amorphous selenium 16 is approximately 150 microns thick. The physical properties of selenium are listed in Table I. The transparent insulator 18 is mylar. The transparent conductor 20 may be Nesa glass, a thin film of metal deposited directly on the transparent insulator 18, or a plastic film with a conductive coating, i.e., gold covered mylar. The entire structure 10 may be made by depositing successive layers of selenium, mylar and a thin film of metal onto an aluminum plate. Assembly may be accomplished by vapor deposition, sputtering, or any other technique useful to deposit even thickness films. This technology is well developed in the art of semiconductor electronics and glass manufacturing.

The thickness of the selenium layer must be selected to maximize quantum efficiency of the detector. This optimum thickness will be a function of the photoconductor's characteristics, the potential at which the detector is operated and the energy of the X-ray photons or other particles to which the detector is exposed that act to discharge it.

Basically, the thicker the selenium, the more it interacts with a given energy of exposing radiation and the more electron-hole pairs a given quantity of radiation produces. Conversely, as the selenium layer is made thinner the electric field acting on these electron-hole pairs becomes stronger (the same potential over less distance). Thus a very thin layer of selenium would not interact with the exposing radiation enough to produce electron-hole pairs while a very thick layer of selenium would result in the production of lots of electron-hole pairs, but they would all recombine when the exposure stopped.

The optimum thickness of the photoconductor layer of the detector will depend on the characteristics of the photoconductor and the energy of the X-ray photons it is designed to sense. In the experimental embodiments of the present invention applicants have found that from one hundred microns to four hundred microns thickness of amorphous selenium is optimum for the X-ray photon energies commonly used in diagnostic radiology.

There are several facts the inventors discovered experimentally that should be mentioned.

When several experimental prototype detector structures were built under laboratory "clean room" conditions they worked poorly. Regular aluminum backed selenium-xeroradiography plates covered with gold covered mylar plastic and assembled with optical cement under less than ideal conditions work very well.

It appears that a very thin aluminum oxide layer between the selenium and the aluminum acts as a blocking contact, i.e., a diode, to retain the positive charge on the surface of the selenium. This blocking layer has a blocking potential that must be overcome for current to flow through the contact.

Also, when the experimental detectors built by the inventors were scanned fast, a higher signal strength output was obtained than when they were scanned slowly. Since the light intensity was the same, the faster scan was predicted to result in lower signal strength. Applicants cannot yet explain this phenomena, but, by pulse modulating their light source for between 2 nanoseconds and 10 microseconds on and off, this effect can be used to increase signal strength from the present invention.

Finally, repeated use of the prototype plate resulted in the development of "artifacts", i.e., lines and trash on the image. Repeated use also caused an overall loss in detector sensitivity. It was accidentally discovered that heating the prototype plate for a short time with a heat gun used to shrink plastic tubing removed these artifacts and otherwise generally restored the detector's performance.

Figure 1A:
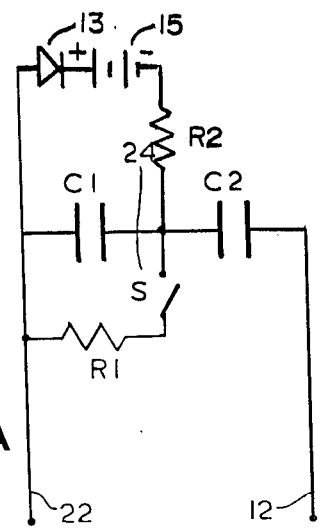
FIG. 1A is a schematic electrical diagram illustrating the electric circuit analog of the structure shown in FIG. 1.

In FIG. 1A R1 represents the resistance of the photoconductive layer when it is flooded with light. R2 represents the resistance of the photoconductor layers when it is in the dark. C2 represents the electrical capacity manifested by the charge separation across the transparent insulator 18. One charge polarity resides on the transparent conductor 20 and the other on the surface of selenium which is in immediate contact with insulator 18. C1 represents the electrical capacity of the detector measured between the aluminum conductor 14 and the selenium surface 16. The selenium is thus the dielectric material of C1.

FIG. 1A shows an electrical schematic illustrating an electronic analog of detector sandwich structure 10 shown in FIG. 1. R1, R2, C1 and C2 are shown schematically connected in FIG. 1A as electrical symbols. Switch 24, which is shown open, is used to represent the photoconductive nature of selenium layer 16 of FIG. 1. Selenium has a dark resistance of approximately $10^{16}$ ohm-centimeter. A portion of this resistance is caused by a blocking contact formed at the Se-Al interface. When photons strike the photoconductor its resistance is lowered because the photons create electron hole pairs that carry current. This lower resistance is illustrated schematically in the electrical analogs contained in this specification by a closure of switch 24 leaving only residual resistance R1, which represents the forward resistance of the blocking contact in series with the resistance of the selenium layer when it is flooded with photons. For a current to flow when the photoconductor is flooded with light the blocking potential of blocking contact 11 must be overcome.

TABLE I

| Physical Properties of Selenium (2,3) | |
|---|---|
| Atomic Number | 34 |
| Density (g cm$^{-3}$) | 4.25 |
| Dielectric Constant | 6.6 |
| Resistivity at 20° C. ($\Omega$-cm) | $10^{13}$–$10^{16}$ |
| Thermal Conductivity at 20° C. (Wcm$^{-1}$K$^{-1}$) | $2 \times 10^{-3}$ |
| Optical Band Gap (2V) | 2.3 |
| Photo Response Edge (AE) | 4600 |
| K absorption Edge (KeV) | 12.7 |
| Mobility of Holes (cm$^2$s$^{-1}$v$^{-1}$) | 0.14 |
| Mobility of Electrons (cm$^2$s$^{-1}$v$^{-1}$) | $5 \times 10^{-3}$ |
| Energy for Production of Charge Carriers (eV) | 7* |

*W = $2.67 \times E_g + 0.86$ eV in which $E_g$ is the optical band gap

Figure 2:
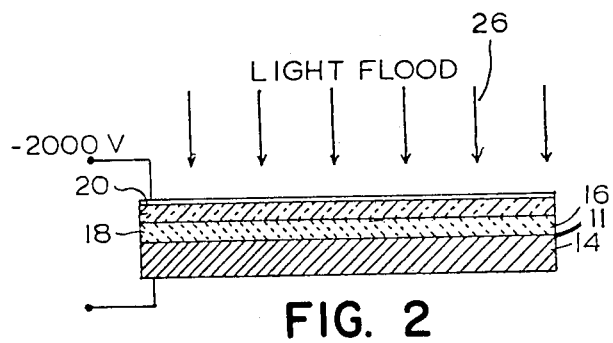
FIG. 2 is a view of the structure shown in FIG. 1 being flooded with photons.

FIG. 2 illustrates detector 10 being flooded with photons 26. Simultaneously a negative high voltage, i.e., 2,000 volts is applied to terminal 22 hence to transparent conductor 20.

Figure 2A:
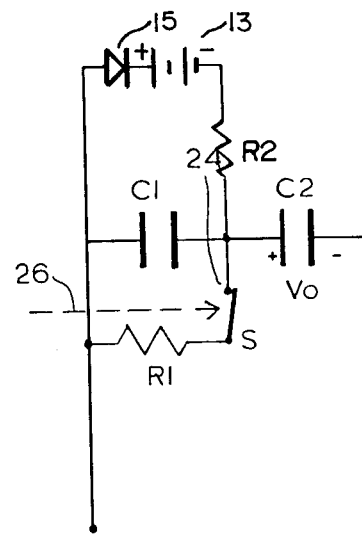
FIG. 2A is a schematic showing the electric circuit analog of FIG. 2.

FIG. 2A, the electrical schematic analog of FIG. 2, shows switch 24 closed by light 26. The −2,000 volt potential, Vs, is impressed across electrodes 12 and 22.

Figure 3:
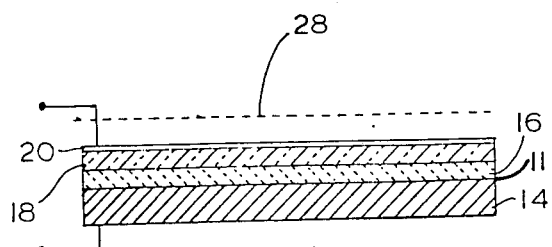
FIG. 3 is a view of the detector structure after it is charged, flooded with photons and the surface charge has been redistributed.

FIG. 3 shows the semiconductor detector sandwich 10 after light 26 has been extinguished and leads 12 and 22 shorted together. The resulting positive surface charge on the amorphous selenium layer is illustrated diagrammatically by dotted line 28. This surface charge is uniformly distributed over the entire surface.

Figure 3A:
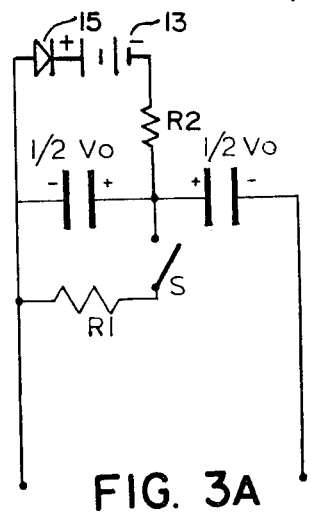
FIG. 3A is the electrical schematic analog of the detector as it is shown in FIG. 3.

FIG. 3A is FIG. 3's electrical analog. The detector is in darkness, so switch 24 is illustrated as open. Diode 15 and battery 13 represent the blocking contact and potential, respectively, of blocking junction 11. The electric charge originally present on capacitor C2 has redistributed so that a portion of that charge is present on capacitor C1. The exact portion being dependent upon the ratio of C1 to (C1+C2).

FIG. 4 shows the charged detector illustrated in FIG. 3 used as an image receptor structure for an X-ray image. Uniform X-ray flux 30 is generated by a convenient source of radiation, such as an X-ray tube, not shown. The detector will work with any radiation source capable of generating electron-hole pairs in the photoconductor. This uniform photon flux encounters and interacts with object 32, which may be any object of interest. Object 32 is placed directly over detector 10. For simplicity, object 32 is represented as an oblate spheroid of uniform density.

FIG. 5 shows a greatly enlarged schematic view of a portion of detector structure 10 of FIG. 4. Modulated X-ray flux 34 from the radiation that has passed through object 32, creates electron-hole pairs 36 in selenium layer 16.

FIG. 6 shows detector 10 of FIG. 4 after the X-ray exposure has been completed. The detector is now storing a latent image. The modulated surface charge comprising the image is schematically illustrated by a humped dotted line 38. This dotted line represents the change in potential created by the electron-hole pairs generated by the X-ray exposure.

FIG. 7 shows detector 10 having a latent image stored as a modulated surface charge 38. A thin beam of light 40 is shown scanning the surface of photodetector conductive layer 16 in a regular raster pattern. In the experimental system under 1 embodiment of the present invention, this thin scanning light beam is produced by a He-Cd laser.

It should be understood that the photon beam need not be coherent. It may be of any frequency capable of creating electron-hole pairs in photoconductive layer 16 of detector 10.

Electrode 41 is connected to electrical ground and electrode 43 carries a video electric signal whose wave form is a function of modulated surface charge 38 in detector 10 scanned by light beam 40.

Arrow 42 indicates the direction of movement of scanning light beam 40. Output wave form 44 indicates the voltage variation of the output video signal obtained by said beam's scanning the latent image.

FIG. 8 is a schematic highly enlarged cross-sectional view of a portion of the detector structure being scanned by light beam 40 of FIG. 7. Light beam 40 penetrates the transparent conductor and transparent insulator to generate electron-hole pairs 36 in that portion of selenium layer 16 irradiated by the beam.

Functionally, detector 10 operates by placing a uniform surface charge on selenium layer 16 and then selectively discharging part of this surface charge by X-ray exposure to form a latent image.

As shown in FIG. 2, when light photons flood detector 10, selenium photoconductor layer 16 becomes conductive. If, as shown, a $-2,000$ volt potential is applied between the aluminum backplate (at ground) and the transparent conductor 20 (at $-2,000$ volts potential), then the detector will charge as a capacitor. FIG. 2A illustrates how this charge is applied to the system. Light flood 26 increases conductivity in the selenium layer 16. The applied voltage $V_s$ is $-2,000$ volts. This causes a charge to build up across capacitor C2, which represents the capacity between the surface of the selenium in contact with the transparent insulator and the transparent conductor of detector 10. Capacitor C2 thus charges to potential $V_s$ of 2,000 volts.

After capacitor C2 has charged to potential $V_s$, the light flood is removed and detector 10 is stored in darkness. In the absence of photons, amorphous selenium layer 16 becomes nonconductive and its dark resistivity in synergistic combination with blocking contact 11 prevent the surface charge on the selenium from leaking off. This condition is illustrated by FIGS. 3 and 3A. After detector 10 is in darkness, terminals 22 and 12 are shorted together. This causes the electric charge on capacitor C2 to redistribute between capacitor C2 and C1, each of which is then charged to a potential of one-half $V_s$, i.e., 1,000 volts, if C1=C2. Capacitor C1 represents capacitance between the surface of the photoconductive layer 16 and the aluminum backing 14. This 1,000 volt surface charge is distributed uniformly over the selenium layer's surface. This surface charge is maintained across the selenium layer by the high dark resistivity of the selenium in conjunction with the now reverse biased blocking junction at the Al-Se interface. The effective blocking potential of this junction has been experimentally determined to be about 150 to 300 volts in the experimental systems discussed below.

Resistance R1, representing resistance of the selenium layer when it is exposed to light, is relatively low compared to its dark resistance R2.

Each photon striking the photoconductor depending on its energy, generates a specific number of electron-hole pairs within photoconductive layer 16 (see Table II). Each electron-hole pair discharges a portion of the surface charge at the spot it is generated.

FIG. 4 illustrates how this effect is used to impress a latent image on the detector.

FIG. 4 is a cross-section schematic view of the photon detector structure taught by the present invention being used as the image receptor in an X-ray system.

A uniform flux of X-ray photons 30 is modulated, i.e., partially absorbed, by its passage through an object being X-rayed 32. The modulated X-ray flux then strikes detector 10.

Detector 10 has a 1,000 volt surface charge, as was illustrated by charge 28 in FIG. 3, impressed on selenium layer 16. As the X-ray photons strike the selenium layer, they generate electron-hole pairs. For monochromatic X-rays the number of electron-hole pairs generated is a direct function of the number of X-ray photons striking the selenium detector layer.

Some of the X-ray photons in uniform flux 30 are absorbed by object 32. Thus the modulated flux striking photoconductive layer 16 contains information about the internal structure of the object being x-rayed. This information is contained in the number of photons striking each portion of the detector.

FIG. 5 illustrates how this modulated X-ray flux creates a modulated surface charge on the surface of the detector. Modulated X-ray flux 34 generates electron-hole pairs 36 in selenium layer 16 of detector 10. The number of electron hole pairs generated at each point on the surface of the detector is a function of the number of X-ray photons impinging on the photoconductive layer. Each electron-hole pair 36 discharges a portion of the surface charge impressed on the photoconductive layer at the point where it is generated. The greatest number of electron-hole pairs will be generated where the X-ray photons from uniform flux 30 strike the detector without any absorption from the object being x-rayed. A lesser number of X-ray photons will strike the photoconductive layer under the object being X-rayed. The radioopacity of the object being X-rayed is thus reproduced in the surface charge of the detector structure after X-ray exposure.

FIG. 6 schematically illustrates the detector structure's modulated surface charge after the X-ray exposure described in connection with FIGS. 4 and 5.

The surface charge is lower where no object absorbed X-ray photons. The object being X-rayed, which is assumed to be uniformly opaque to X-rays, absorbs a portion of the uniform X-ray flux. This results in the generation of fewer electron hole pairs under the object and a higher surface charge on the detector under the object being X-rayed. This is represented by modulated surface charge dotted line 38.

FIG. 7 illustrates schematically the readout method used to extract an electric video signal from the modulated surface charge which forms the latent image on a detector structure taught by the present invention.

The detector structure is kept in darkness and a thin beam of light, preferably generated by a helium-cadmium laser, is scanned in a regular raster pattern across the surface of photoconductor 16.

As the scanning light beam 40 moves in direction illustrated by arrow 42, it produces a small moving spot on the surface of photoconductive layer 16. The size of this spot determines the resolution of the final image. It is therefore desirable that this spot size be kept small.

As laser beam 40 scans the surface of photoconductive layer 16, it generates electron-hole pairs as is illustrated in detail by FIG. 8. These electron-hole pairs are mobile within the photoconductive layer and discharge a portion of the surface charge. In the preferred embodiment of the present invention the electrons move toward the positively charged selenium surface of the detector sandwich structure 10. The voltage drop produced across the resistor connected between ground connection 41, which is attached to transparent conductor 20 and video output electrode 43, which is attached to aluminum conductive backplate 14 will be a function of the intensity of the surface charge at the point where the laser beam generates the electron-hole pair.

Scanning laser beam 40 thus produces a modulated electric signal 44 at output electrode 43. The voltage of this output electric signal will be a function of the surface charge present at the spot where the laser beam strikes the photoconductive layer of the detector. The current present in the output circuit is a function of the frequency and intensity of the scanning light beam and is a further function of the speed with which the light beam scans the surface of the photoconductor. Video signal 44 can be electronically processed to produce an image that reproduces the latent image found in the surface charge of the photoconductive layer of the detector.

Depending on the intensity of the surface charge; the beam scanning speed; and the frequency and intensity of the light beam used, the surface charge may be repetitively scanned several times by the beam of light.

Table II lists the values for the thickness of the selenium layer, the X-ray photon energy, the fraction of this energy absorbed by the selenium layer, quantum conversion between X-ray photons and electron-hole pairs, dark resistance of the selenium and the total receptor area of detector 10 used in calculating the operating parameters of a sample detector constructed according to the preferred embodiment of the present invention.

TABLE II

| Assumed Values | |
| --- | --- |
| Thickness of Selenium Layer | 100 microns |
| Energy Radiation | 21 keV |

TABLE II-continued

| Assumed Values | |
| --- | --- |
| Absorbed Fraction of photons | 85% |
| Quantum Conversion | 3000 electron/photon |
| Surface Voltage | 1000 V |
| Photon Flux/Roentgen | $5 + 10^9$ cm$^{-2}$ |
| Dark Resistivity | $10^{16}$ Ω cm |
| Total Receptor Area | 560 cm$^2$ |

Table III lists the calculated capacity of the detector sandwich structure, the charge density present in this structure when the surface potential is 1,000 volts, the number of elementary charges present per square centimeter in the structure and the dark resistance and dark current of the detector at a thousand volts charge.

TABLE III

| Calculated Values | |
| --- | --- |
| Capacitance | $5.8 \times 10^{-11}$ F/cm$^2$ |
| Charge Density at 1000 Volts | $5.8 \times 10^{-8}$ Coul/cm$^2$ |
| Number of Elementary Charges | $3.6 \times 10^{11}$ el/cm$^2$ |
| Dark Resistance | $10^{14}$ Ω/cm$^2$ |
| Dark Current at 1000 Volts | $10^{-11}$ A/cm$^2$ |

Using the values from these tables it is possible to calculate operating parameters for a typical detector system constructed according to the preferred embodiment of the present invention.

If detector 10 has an area of 560 square centimeters and is exposed to uniform flux of 21 keV X-rays resulting in an exposure of Np X-ray photons per unit area, then the total number of electron hole pairs generated will be 3,000 N$_p$. Information theory requires that three times as many electron-hole pairs be generated as are present at the statistical noise level of the system for the latent image to be detectable.

There are approximately 5 times 10$^9$ photons per square centimeter per roentgen of X-ray exposure at 21 Kev. Thus the minimum detectable radiation exposure that will produce a detectable latent image in the selenium sandwich structure taught by the preferred embodiment of the present invention (for a 560 square centimeter detector) is approximately 23 micro roentgens per exposure. This may be thought of as the theoretical lower limit of exposure to generate a 10 line pair per millimeter image with the present invention.

Turning now to a practical example, if the X-ray exposure of a patient scan is 100 mR and at the thinnest section of the X-rayed object 50% of this radiation is absorbed by the sample, then exposure at the detector at the brightest portion of the image amounts to 50 mR while the lowest theoretical detectble dose, as was discussed above, amounts to 23 μR. This theoretically yields a latent image represented by modulation of the surface charge present on the detector at a ratio between the brightest and the darkest areas of the image of approximately 2,000.

The example discussed above shows that the detector structure taught by the present invention is theoretically capable of recording an image using a selenium photoconductive layer with a resolution of 10 line pairs per millimeter and a brightness range of over 2,000 after a total X-ray exposure of only 100 mR. An example of how this latent image can be read out of the detector follows.

Figure 9:
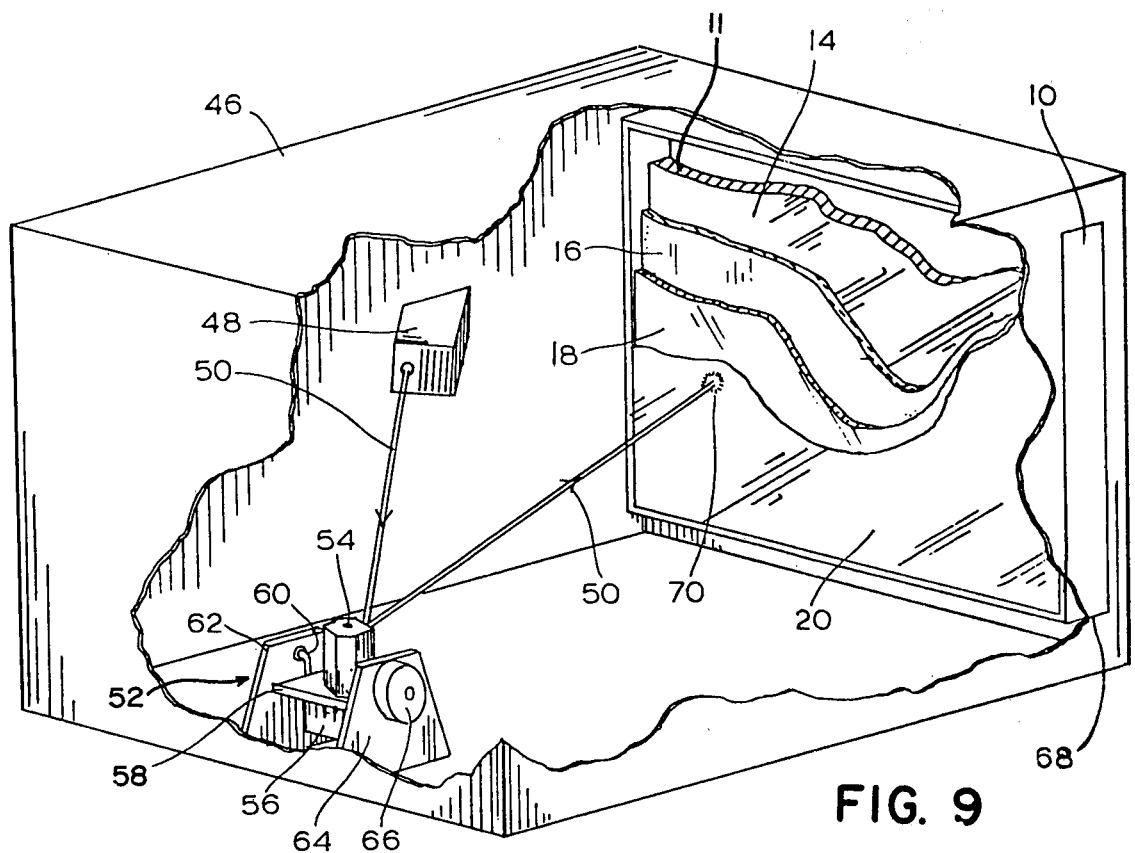
FIG. 9 shows a partially cut-away view of an apparatus adapted to practice the preferred embodiment of the present invention.

FIG. 9 shows a partially cut-away view of an apparatus capable of reading out the image whose generation was discussed above.

Light-tight housing 46 contains a light source 48 aligned so as to project a light beam 50 onto the front of a scanning means 52 which may be a rotating multi-sided mirror. Mirror 52 is mounted on an axis 54 which is operably attached to a scanning motor 56. The mirror axis and scanning motor are affixed to a platform 58. This platform is mounted on an axis 60 which is orthogonal to axis 54. Axis 60 is mounted at one end to first upright support 62 and its other end to second upright support 64. The end of axis 60 is swingably mounted in second upright 64 and is operably attached to stepping motor 66.

The entire scanning means comprising the mirror and associated positioning components is available from Texas Medical Instruments, Inc., 12108 Radium, San Antonio, Tex. 78216.

Mirror 52 and its associated scanning mechanism is located at one end of housing 46. A multilayered photon detector apparatus 10 is removably inserted through a light-tight opening 68 into a holder at the other end of housing 46 such that deposited transparent conductive layer 20 faces toward mirror 52.

Light source 48 is preferably a Helium-Cadmium laser such as a Liconix model #402 laser with an optical modulator. This laser produces a beam of intense light at approximately 4,400 angstroms.

Scanning motor 56 rotates multi-sided mirror 52 on axis 54 to cause light beam 50 to scan horizontally across the surface of detector 10. This causes spot 70 to intersect the selenium photoconductive layer as was discussed in connection with FIGS. 7 and 8 above. Each time spot 70 moves from the left to the right side of detector 10, stepping motor 66 moves platform 58 through sufficient arc to deflect spot 70 vertically 1/20th of a millimeter. This stepping-scanning function may be controlled mechanically or electrically. By convention, spot 70 begins scanning the surface of detector 10 at its upper left hand corner. After raster scanning the entire surface of the detector, the scanning mechanism may be programmed either to turn off or to rescan the plate.

Figure 10:
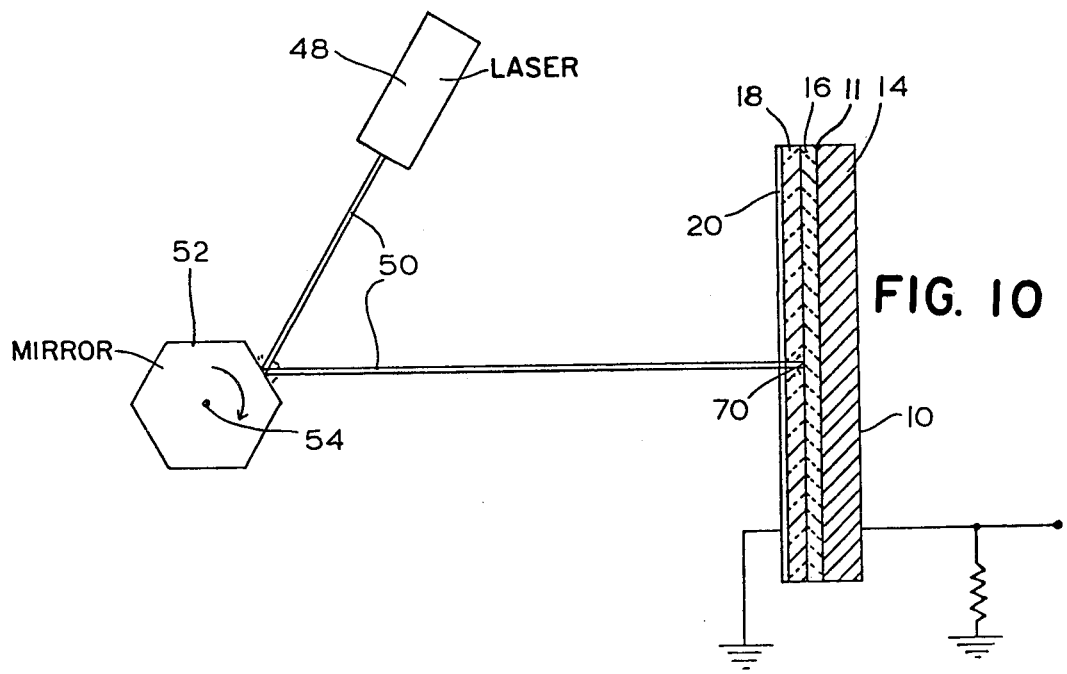
FIG. 10 is a simplified diagram showing the major parts of the apparatus shown in FIG. 9.

FIG. 10 is a simplified schematic view of the scanning readout mechanism shown in FIG. 9. Light beam 50 from laser 48 reflects off of the polygonal surface of multi-sided mirror 52 as that mirror rotates on axis 54. This causes light beam 50 to generate flying spot 70 which moves across the surface of detector structure 10. As was discussed in connection with FIGS. 7 and 8, above, this causes a video signal to be generated across the detector structure.

Theoretically, photons from light source 48 have a wave length of approximately 4,400 angstroms. The quantum yield of these photons and selenium approaches unity when field strength nears $10^5$ volts per centimeter. In a 150 micron selenium plate, such as is used in the preferred embodiment of the present invention, this corresponds to a thousand volts surface potential.

It is possible to pulse the laser to decrease the scanning time required to obtain an image from the detector structure. In the present example, the laser beam may be pulsed for a 100 nanoseconds period with 3 to 4 microsecond spacing between pulses. This illuminates each image element sufficiently to readout a latent image stored in the detector. The practical advantage of such a regime is to permit much shorter sampling times. It may also result in higher signal strengths.

Figure 11:
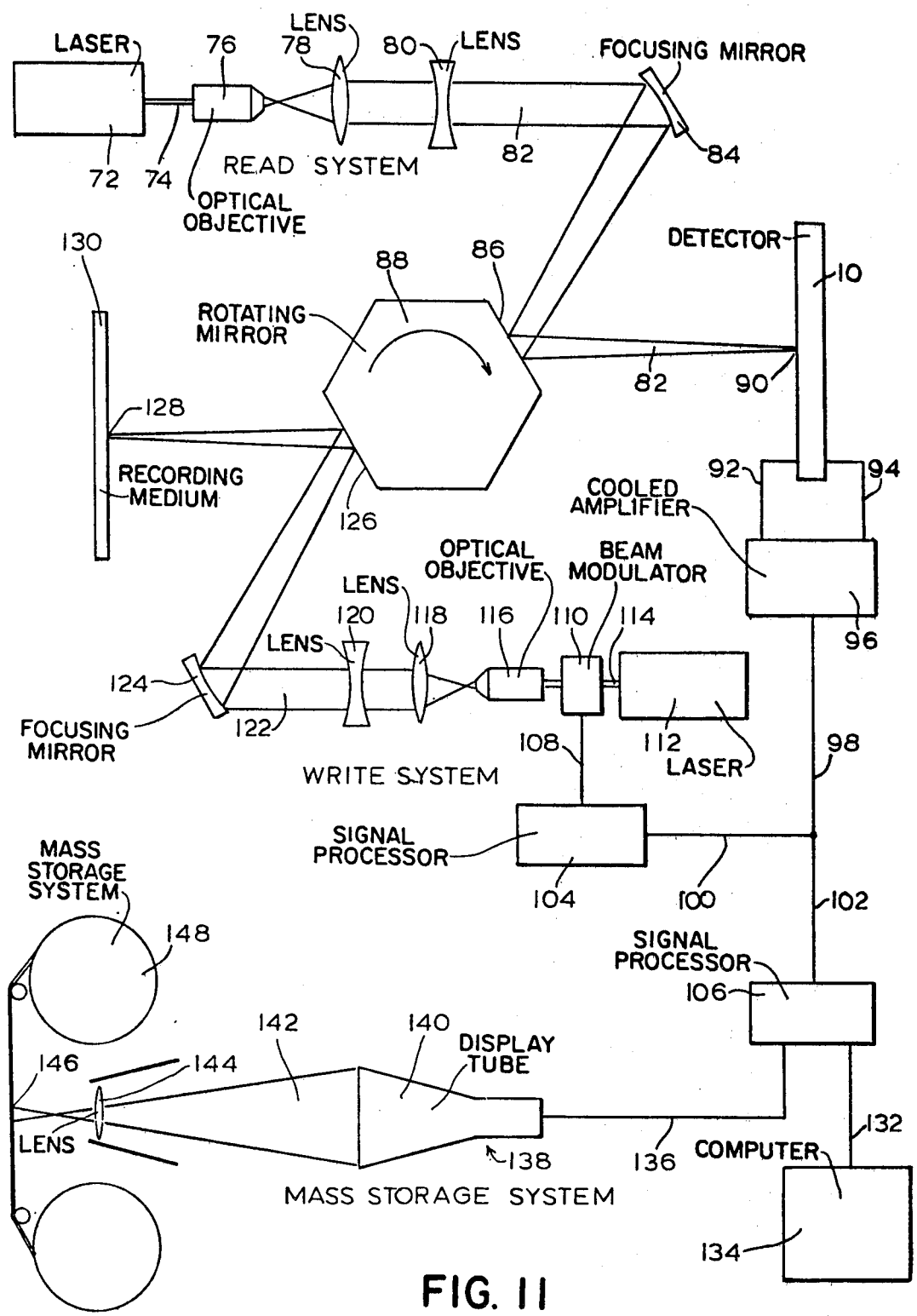
FIG. 11 is a schematic block diagram illustrating a diagnostic X-ray system constructed according to a preferred embodiment of the present invention.

FIG. 11 is a block diagram of a radiographic X-ray system taught by the preferred embodiment of the present invention. Laser 72 produces a small intense beam of light 74 which is expanded by optical objective 76 and lenses 78 and 80 into a reasonably wide parallel beam 82. Focusing mirror 84 reflects beam 82 on the reflective surface 86 of scanning mechanism 88. Scanning mechanism 88 is substantially the same as the scanning mechanism discussed in connection with FIG. 9 above. This scanning mechanism may be any apparatus capable of moving the Laser beam over the detector and film. For example it may be a set of computer controlled mirrors or holographic optics.

Beam 82 projects a small flying spot 90 onto the surface of detector structure 10. Detector structure 10 was discussed in detail in connection with FIGS. 1 through 8, above.

Detector structure 10 is electrically connected by lines 92 and 94 to cooled amplifier 96. Amplifier 96 may be a low noise amplifier. Amplifier 96 is connected by line 98 to lines 100 and 102 which electrically connect the output of cooled amplifier 96 to signal processor 104 and second signal processor 106, respectively. Signal processor 104 is connected by line 108 to beam modulator 110. Laser 112 produces an intense beam of coherent light 114 which is modulated by beam modulator 110 and spread by objective 116 in lenses 118 and 120 to coherent modulated beam 122. Modulated beam 122 is focused by focusing mirror 124 onto a second mirror surface 126 of optical scanner 88. This surface may be another surface of the same scanner or may be a separate optical scanning system.

Mechanical movement of scanning system 88 causes beam 122 to form flying spot 128 which scans the surface of recording medium 130. This process allows the very low intensity latent image on detector structure 10 to be electrically amplified by cooled amplifier 96 and signal processor 104 and then to be rewritten as an intensified image on a photographic or xeroradiographic plate 130.

The electrical output of cooled amplifier 96 also is fed to signal processor 106 by lines 98 and 102. The output of signal processor 106 is connected by line 132 to a digital computer 134. Computer 134 is used to digitally store and manipulate the information imparted to it by the electrical signal produced by cooled amplifier 96 by way of signal processor 106. The images may be stored on magnetic tape or disc files and can be manipulated within the computer by algorithms for image edge enhancement or pattern recognition for automated diagnosis.

The output of signal processor 106 also goes by line 136 to mass storage system 138.

Mass storage system 138 contains a high resolution display tube 140 which produces an analog image 142 which is focused by focusing optics 144 onto film plane 146 of a mass film storage system 148. This mass film storage system may be a 35 or 70 mm cassette system.

The type of radiographic image processing and storage system described in connection with FIG. 11 is especially useful for interfacing mass radiographic data acquisition equipment with the central computing facilities of a large hospital complex. Digital storage of the radiographic images allow the data to be accessed by a remote radiologist with speed and precision. Computer-based pattern recognition algorithms allows inexpensive gross screening of large patient populations for radiographic anomolies. The system's ability to rewrite information obtained at very low radiation dosages onto conventional xeroradiographic plates or films permits the system to protect the patient while interfacing with presently existing radiographic data storage formats.

As will be discussed further below, the radiographic data comprising the latent image on detector structure 10 may be read out in real time to produce a video image which may be studied by the radiologist.

Figure 12:
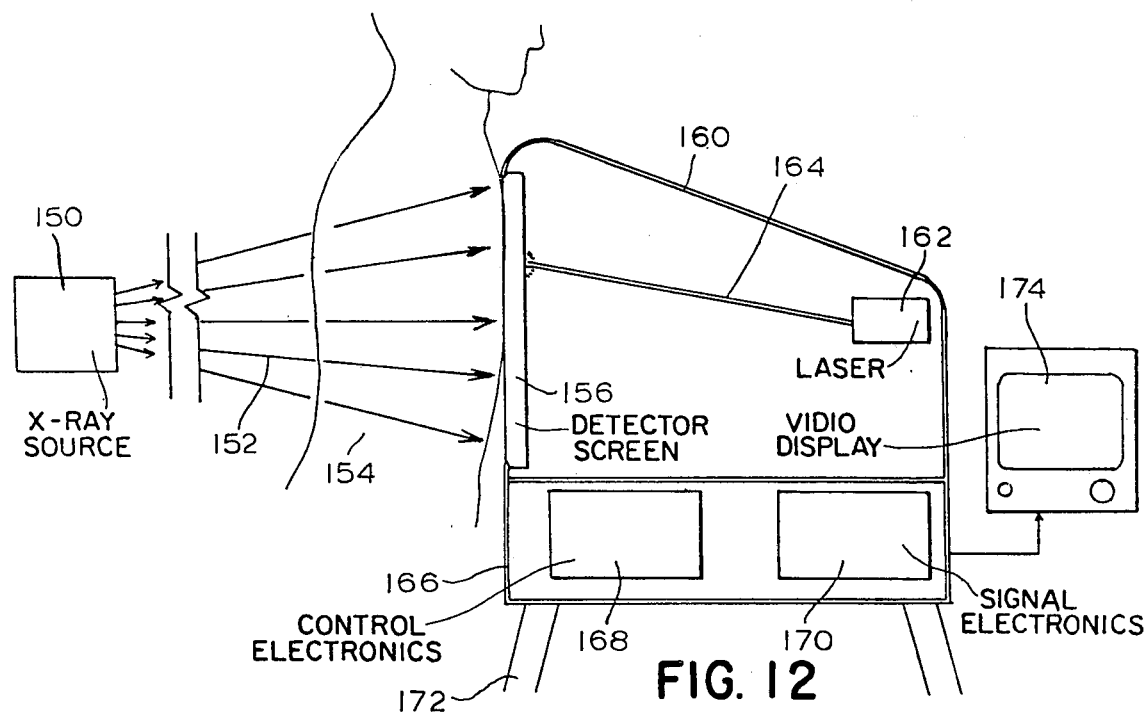
FIG. 12 shows a cross-sectional view of a clinical apparatus for conducting mass chest radiographic screening using the present invention.

FIG. 12 shows a mass screening system constructed according to the preferred embodiment of the present invention. The embodiment shown in FIG. 12 could be used for real time read out of chest films in a mass screening program. X-ray source 150 produces a uniform flux of X-rays 152. Uniform flux 152 passes through and is modulated by patient 154. The modulated X-ray flux impinges onto multilayered photon detector apparatus 156.

Figure 13:
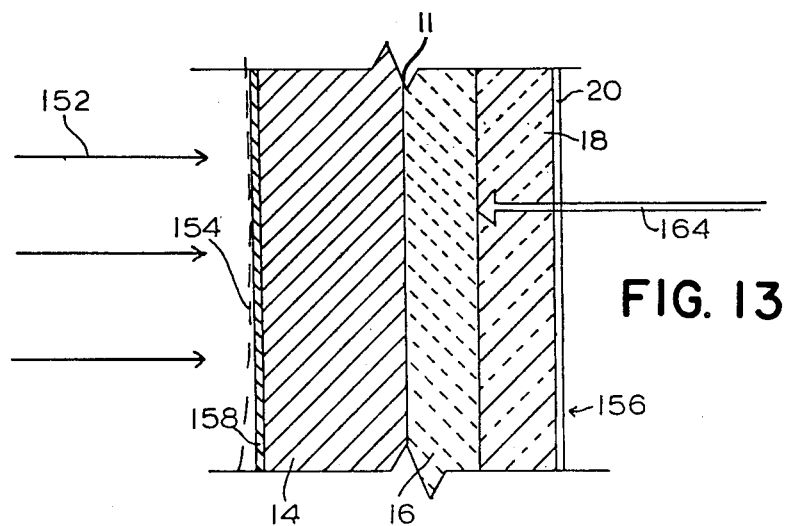
FIG. 13 is a highly enlarged schematic cross-sectional view of an embodiment of the present invention used in the apparatus shown in FIG. 12.

FIG. 13 shows a highly enlarged cross-sectional view of a portion of detector sandwich structure 156 used in FIG. 12.

Detector structure 156 is like detector structure 10 described in FIGS. 1 through 8, above, except that it is positioned so the modulated X-ray flux impinges on the selenium photoconductive layer after it passes through the aluminum backplate. Additionally, a thin insulating layer 158 has been added to the outer surface of the aluminum support structure to electrically insulate the aluminum layer from patient 154.

Detector sandwich structure 156 is mounted within light-tight housing 160. Housing 160 also contains a means for scanning the detector structure with a thin beam of light, i.e., laser scanning system 162 which projects light beam 164 in a raster pattern onto the back side, i.e., the conductive transparent coating side, of detector 156. Base 166 of housing 160 contains control electronics 168 and signal electronics 170. The entire housing and base may be mounted on legs 172 to raise detector structure 156 to chest height of patient 154.

Control means 168 comprises electronics necessary to control the scanning pattern of laser scanner 162 so as to cause light beam 164 to scan the photoconductive side of detector 156 in a regular raster pattern. The control electronics also controls X-ray source 150 and synchronizes exposure and readout operations.

Signal acquisition means 170 comprises electric amplifiers connected to the video output of detector 156. Signal electronics 170 amplifies the detector output and provides a video output capable of operating video display means 174, which may be a high resolution video display monitor.

Operationally, the mass screening system shown in FIG. 12 is a small portable unit. Patient 154 steps up to the unit and presses his chest against thin insulating layer 158 over the aluminum back plate of detector structure 156. X-ray source 150 is then turned on by the control means and irradiates the patient with under 100 mR of X-ray radiation. As is shown in FIG. 13, this modulated X-ray flux penetrates thin insulating layer 158 and the aluminum backplate of detector 156. The X-ray flux then generates electron hole pairs in the selenium detector structure as was discussed in connection with FIGS. 2 through 6, above. The effect of X-rays being absorbed in the selenium with consequent neutralization of surface changes, is a displacement current that flows as C2 redistributes its charge over C1. When this current is integrated over time it will reach a preset value. Control circuitry will then terminate the X-ray exposure. Use of such circuitry insure images of equivalent quality regardless of the thickness of the patient. The above device or operation is called "automatic photo-timing" or "automatic exposure control".

Referring again to FIG. 12, as soon as the exposure is completed, control electronics 168 causes laser scanner 162 to scan light beam 164 across the surface of the selenium photoconductive layer in a regular raster pattern as was described in connection with FIGS. 7 through 10, above. This causes detector 156 to produce a video signal containing image information. This video signal is fed to signal electronics 170 where it is amplified to provide a video output to TV monitor 174.

Such a system may be used to make a clinical radiograph of any body part including; breast, chest, head, etc.

The detector itself, being a replacement for film in a radiographic system, can be used with intensifying screens. One embodiment of the detector structure would use a phosphor, preferably a high Z rare earth phosphor, in plate of insulating layer 18 in FIG. 1. The X-rays striking the phosphor would generate light which would create ion-hole pairs in photoconductive layer 16.

DERIVATION OF THE CHARACTERISTIC CURVE OF THE DETECTOR

This section refers to the derivation of the curve shown in FIG. 25.

When the experimental system is exposed to light, a total charge of $Q_L$ coulombs will flow in the external circuit where $$Q_L = \frac{2V_s C_2 2}{C_1 + C_2} \text{ coul/pixel} \tag{1}$$

Exposure to X-radiation prior to such a light exposure would simply reduce $Q_L$ proportional to the X-ray exposure dose.

One may compute the charges placed in motion due to absorbtion of X-ray photons by first defining the photogeneration efficiency $\eta$ after Fender $$n = \frac{d\epsilon}{dn} \cdot E \left( \frac{ev}{\text{ion pair}} \times \frac{\text{Volts}}{\mu} \right) \tag{2}$$

where E is the energy deposited within the selenium in ev due to absorbed photons, n is the number of ions which neutralize the charge on the surface of the absorber and E is the average electric field across the absorber. Also we note, $$n = \frac{Q_x A}{e} \text{ and } dn = \frac{A}{e} dQ_x \tag{3}$$

where $Q_x$ is the surface charge neutralizer in coulombs per square centimeter, A the area of the absorber in square centimeters and e the electronic charge in coulombs/ion-pair. The energy absorbed may be calculated as $$\epsilon = fkXA \text{ and } d\epsilon = fkAdX \tag{4}$$

where f is the fraction of X-ray energy absorbed in the selenium, k is the photons fluence in air per roentgen exposure and X is the exposure in roentgens. Also since the electric field is that which exists within the selenium, $$E = (Q^*_1/C_1 d_1) \tag{5}$$

where $Q^*_1$ is the instantaneous charge existing across the selenium, $C_1$ the capacitance of the selenium layer and $d_1$ the thickness of the selenium. Substituting (3)(4) and (5) into (2) we have $$n = \frac{fkeQ^*_1}{C_1 d_1} \cdot \frac{dX}{dQ_x} \tag{6}$$

From (1) we may express $Q_1$ as $$Q^*_1 = \frac{2V_s C_1 C_2}{C_1 + C_2} - \frac{Q_x C_1}{C_1 + C_2}$$

substituting in (6), we have the differential equation, $$\frac{dQ_x}{dX} + \frac{fke}{d\eta(C_1 + C_2)} Q_x - \frac{2kfeC_2 V_s}{\eta(C_1 + C_2)d_1} = 0 \tag{7}$$

the solution of which is $$Q_x = 2C_2 V_s \left(1 - \exp \frac{fkeX}{\eta d_1 (C_1 + C_2)}\right) \text{ if} \tag{8}$$

$$Q_R = Q_x \left(\frac{C_2}{C_1 + C_2}\right) \tag{9}$$

Then the total charges placed in motion when illuminating a pixel which has absorbed X roentgens of X-ray is, $$Q_{sig} = Q_L - Q_R \tag{10}$$

from (1) and (10), $$Q_{sig} = \frac{2V_s C_2^2}{C_1 + C_2} - \frac{2V_s C_2^2}{C_1 + C_2} \left(1 - \exp\left(-\frac{fkeX}{\eta d_1 (C_1 + C_2)}\right)\right) \tag{11}$$

$$Q_{sig} = \left[\frac{2V_s C_2^2}{C_1 + C_2} \exp - \beta X\right] \tag{12}$$

where $$\beta = \frac{fkeX}{\eta d_1 (C_1 + C_2)}$$

Equation (12) is of the form described by Boag in which he states that the radiographic discharge of electrostatic plates is exponential.

FIG. 19 is a plot of $Q_R$ versus $V_s$ for various doses of X-radiation. From such data we may solve equation (8) for $\eta$, the photogeneration efficiency. From FIG. 19 we also note the empirical data predicts a loss of charge which may be due to recombination, however it may also be indicative of deep hole traps within the selenium that establish a residual potential below which the system cannot be discharged.

DESCRIPTION AND DISCUSSION OF THREE METHODS OF CHARGING THE DETECTOR

Charging Method #1

To review briefly, the semiconductor sandwichlike structure, illustrated by FIGS. 1 and 1A above, appears as a pair of capacitors in series. C2 is the capacitor formed in the experimental system by Nesa conductive glass and the surface of the selenium proximate the Nesa. A mylar insulating layer acts as a dielectric. C1 is the capacitor formed by the surface of the selenium and the aluminum substrate; the selenium photoconductor acting as the dielectric. Because photoconductors are not dielectrics when they are illuminated, C1 will exist only when it is in the dark. This ignores such things as deep hole traps, dark currents, etc., but they will be discussed in turn.

Referring to FIG. 1, when a voltage is applied between terminals 22 and 12, a current will flow charging capacitors C1 and C2 to voltages V1 and V2 respectively, where:

$$V_s = V_1 + V_2 \tag{1}$$

In which case:

$$V_2 = V_s \frac{C_1}{C_1 + C_2} \tag{2}$$

Where $V_s$ is the supply voltage.
and $$V_1 = V_s \frac{C_2}{C_1 + C_2} \tag{3}$$

If the selenium layer is illuminated while there is a potential between terminals 22 and 12, capacitor C1 becomes a conductor and allows additional current to flow to C2. This additional charge $Q_1$ is the charge initially residing on $C_1$. That is, since $$Q_1 = C_1 V_1 \tag{4}$$

substituting (3) into (4), $$Q_1 = V_s \frac{C_1 C_2}{C_1 + C_2} \tag{5}$$

The initial voltage across C2 is determined as in (2). The increase in voltage across C2 due to C1 becoming conductive is:

$$V_2 = \frac{Q_1}{C_1} \quad \frac{V_s C_2}{C_1 + C_2} \tag{6}$$

thus the total voltage across $C_2$ is now (2) plus (6) or $$V_2 = V_s \frac{C_1}{C_1 + C_2} + \frac{V_s C_2}{C_1 + C_2} = V_s \tag{7}$$

Because of (1), $V_1$ is now found to be equal to zero. The charge across $C_2$ is now the total Q or $$Q_T = V_s C_2 \tag{8}$$

If the illumination is removed, this voltage distribution will persist until the potential is removed and terminals 22 and 12 are connected together. $C_2$ will now partially discharge into $C_1$ resulting in an equal voltage appearing across $C_1$ and $C_2$ since they are now essentially in parallel. This voltage will be $$V \text{ parallel} = \frac{Q \text{ total}}{C \text{ total}} \quad (9)$$

$$= \frac{V_s C_2}{C_1 + C_2} = V_1 = -V_2$$

Note that $V_1$ and $V_2$ are equal however of opposite polarity.

It will also be noted that no supply voltage $V_s$ is in the circuit during this redistribution of charge. The above operation has resulted in placing a charge on the surface of the selenium much as is accomplished in the Xeroradiographic procedure. In the present invention, however, the charge has been applied to a selenium surface that is physically inaccessible.

The system is now ready for exposure to X-rays. An integrating ammeter or a coulomb meter is placed in the circuit between $C_1$ and $R_2$ such that the current, or net charge movement due to radiation exposure may be measured. This flow of current is proportional to exposure and thus can be used to control the exposure. This is advantageous because it allows the exposure time to be controlled by the amount of radiation actually reaching the detector.

Figure 21:
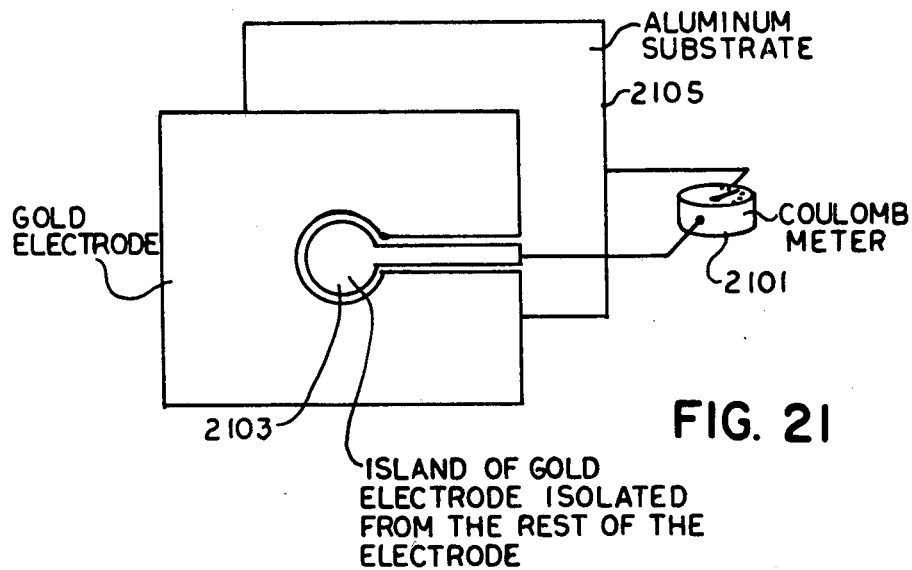
FIG. 21 is a schematic diagram showing a portion of the detector structure used as a radiation exposure detector automatically timing the exposure.

Alternatively the surface of capacitor $C_2$, which is a thin conductive film, may be etched to form a small island as shown in FIG. 21. In FIG. 21 coulomb meter 2101 may be connected between island electrode 2103 and the aluminum substrate 2105. During X-radiation exposure meter 2101 will accumulate a charge which may be used to photo-time the exposure. This is advantageous because regardless of the thickness of the patient, the X-ray machine will stay turned on until the correct amount of charge is collected by the detector, thus insuring a properly exposed image. Several of these isolated islands may be etched in the plate and used as exposure meters.

When the detector is exposed to radiation, electron-hole pairs are created within the selenium which neutralize the charge across $C_1$. As these charges are neutralized, the charge on $C_2$ redistributes. This redistribution maintains the two capacitors at the same potential. Thus the total charge flowing through the external circuit, i.e., through load resistor $R_2$, is the initial charge placed on $C_2$ alone. From (9) we can obtain the voltage across $C_2$, i.e., $$Q_2 = C_2 V_2 \quad (10)$$

$$Q_2 = C_2 V_s \frac{C_2}{C_1 + C_2}$$

Equation (10) is the total charge that will move if the system is not exposed to radiation. Should X-ray exposure occur to create a latent image, a portion; $Q_X$ of the charges on $C_1$ will be neutralized. The charge remaining on $C_2$ will be;

$$Q_{Sig} = (Q_T - Q_X) \frac{C_2}{C_1 + C_2} \quad (11)$$

Where $Q_T = C_2 V_s$ as in (8). If $Q_X = 0$, then Equation (11) becomes (10).

This charge can be accumulated by a coulomb meter and would be a function of the number of electron-hole pairs generated by the X-rays absorbed in the selenium. When the detector is scanned by the laser beam, each pixel, i.e. the area illuminated by the laser beam at rest, is sequentially discharged. Functionally, $C_1$ is made conductive where the light shines. When $C_1$ becomes conductive the charge on $C_2$ can flow through the external circuit. The current which flows through the external circuit is a function of the latent image stored in the photoconductor.

As the laser beam scans across $C_1$ the IR drop appearing across resistor $R_2$ is a video signal.

Charging Method #2

Figure 22:
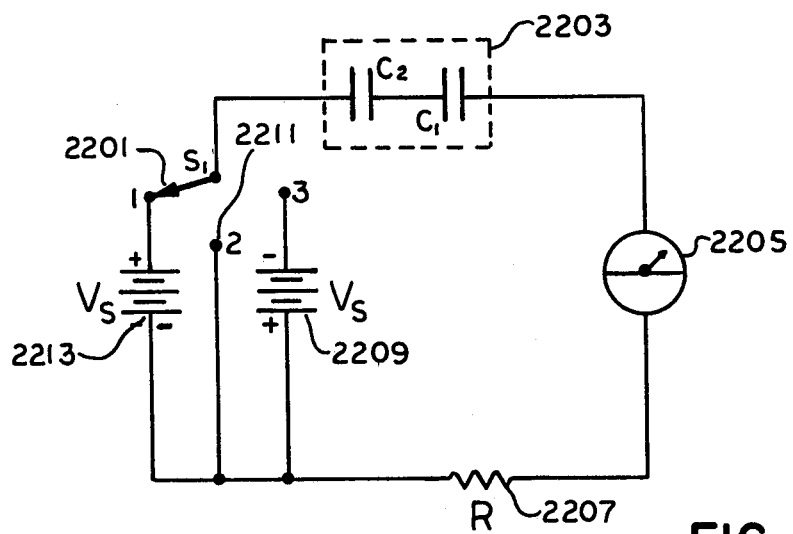
FIG. 22 is an electrical schematic showing the reversed biased mode of detector operation.

Consider the same sandwich-like detector structure in a circuit configuration analogous to the one shown in FIG. 22.

Structurally, three-position switch 2201 is connected to one side of the plate structure 2203 illustrated as capacitor $C_1$ and $C_2$ in series. One side of coulomb meter 2205 is connected to the other side of plate structure 2203. The other side of coulomb meter 2205 is connected to one side of resistor 2207. The other side of resistor 2207 is connected to the positive side of battery 2209; directly to terminal 2211 and to the negative side of battery 2213. The positive side of battery 2213 is connected to terminal 1 of three-position switch 2201. Terminal 2211 is connected to terminal 2 of switch 2201. The negative side of battery 2209 is connected to terminal 3 of three-position switch 2201.

Three position switch 2201 is first placed in the position 1. The voltages across $C_1$ and $C_2$ are the same as shown in FIG. 1 and 1A. If the selenium is now illuminated, $C_1$ becomes conductive as before and $V_2 = V_s$ as in (7). If the illumination is now removed this voltage distribution again persists. Moving switch 2201 to position 2 results in the charge on $C_2$ being distributed over both $C_1$ and $C_2$ as before with $V_1 = -V_2$ as given in (9).

If switch 2201 is moved to position 3, a voltage will exist across $C_2$ which will be that ratio of $V_s$ due to capacitance $C_1$ and $C_2$ less the voltage due to trapped charges (9), i.e., $$V_2 = \frac{V_s C_1}{C_1 + C_2} - \frac{V_s C_2}{C_1 + C_2} \quad (12)$$

or $$V_2 = V_s \left( \frac{C_1 - C_2}{C_1 + C_2} \right) \quad (13)$$

$$= V_s \frac{C_1 + C_2 - 2C_2}{C_1 + C_2}$$

$$= V_s \left( 1 - \frac{2C_2}{C_1 + C_2} \right)$$

$$V_2 = V_s - \frac{2V_s C_2}{C_1 + C_2}$$

since $V_1 + V_2 = V_s$ we find $V_1 = 2V_s \frac{C_2}{C_1 + C_2} \quad (14)$ that is, the voltage across the selenium is now twice that obtained in the other charging method #1.

Now the total charge on $C_2$ is from (13)

$$Q_2 = C_2\left(V_s - \frac{2V_s C_2}{C_1 + C_2}\right) \quad (15)$$

$$= C_2 V_s - \frac{2V_s C_2 C_2}{C_1 + C_2}$$

Under these conditions if the ratio of $C_2/(C_1+C_2)$ is near unity, then $V_2$ will be opposite in polarity to $V_1$ as well as at a lesser potential.

If we assume $C_2=10$ $C_1$, the ratio $C_2/(C_1+C_2)=10/11$, also assuming $V_s=100$ V, from (14)

$$V_1 = 2 \times 100V \times 10/11$$
$$= 181.8 \text{ volts and}$$
$$V_2 = -81.8 \text{ volts}$$

Thus the $Q_2$ as shown in Equation (15) represents a charge opposite to that on $C_1$ and that of the voltage supply $V_s$.

Upon exposure to radiation and/or subsequent readout by the laser, the total $Q_{Sig}$ moving through the external circuit will be that residing on $C_2$ initially plus that required to charge $C_2$ to a voltage of $V_s$ in the opposite polarity. Thus $$Q_{Sig} = -Q_2 + Q_T$$

$$= -C_2 V_s + \frac{2V_s C_2 C_2}{C_1 + C_2} + C_2 V_s$$

or $$Q_{sig} = 2V_s \frac{C_2^2}{C_1 + C_2} \quad (16)$$

If the detector has been exposed to X-rays then, $$Q_{Sig} = (2Q_T - Q_X)\frac{C_2}{C_1 + C_2} \quad (17)$$

here, as before, $Q_X$ are those charges neutralized by the electron-hole created in the selenium by absorbed X-ray photons.

In summary, use of charge method #2 results in doubling the voltage across the selenium without doubling the voltage applied across mylar capacitor $C_2$. This allows capacitor $C_2$ to have a thinner dielectric and thus a higher capacitance. Increasing the value of $C_2$ relative to the value of $C_1$ brings the fraction $C_2/(C_1+C_2)$ nearer to unity, which further increases the detector's signal output. A further advantage of doubling the voltage across the selenium is that the increased electric field strength decreases electron-hole pair recombination in the selenium and increases the efficiency of ion-pair collection. This increases the efficiency of the detector.

Increasing $C_2$, or rather making $C_1$ as small as possible, has two beneficial results:

A. Reducing the capacity of $C_1$ is accomplished by increasing the thickness of the selenium layer in the detector, which increases the detector's X-ray absorption efficiency.

B. Reducing $C_1$ while using the highest possible value of $C_2$ reduces the total capacitance of the detector, since $C_1$ and $C_2$ are in series. This lower total capacitance increases the scan speed that the invention can achieve. This is important because the prior art only teaches the segmenting of a plate into small sections to avoid this large capacitance.

Charging Method #3

It is also possible to use a detector wherein the selenium layer has high effective dark resistivity, but not a blocking contact, which is not charged prior to x-ray exposure. That is, a detector whose photoconductive layer has no surface charge. In this method, an electric potential is placed across the previously uncharged detector only during exposure to the X-rays. This procedure will result in a modulated surface charge conforming to the radio-opacity of the object being x-rayed being placed on the photoconductive layer. The modulated surface charge may be read with a scanning laser beam as described above.

EXPERIMENTAL SYSTEM #2

The Experimental Apparatus

Figure 23:
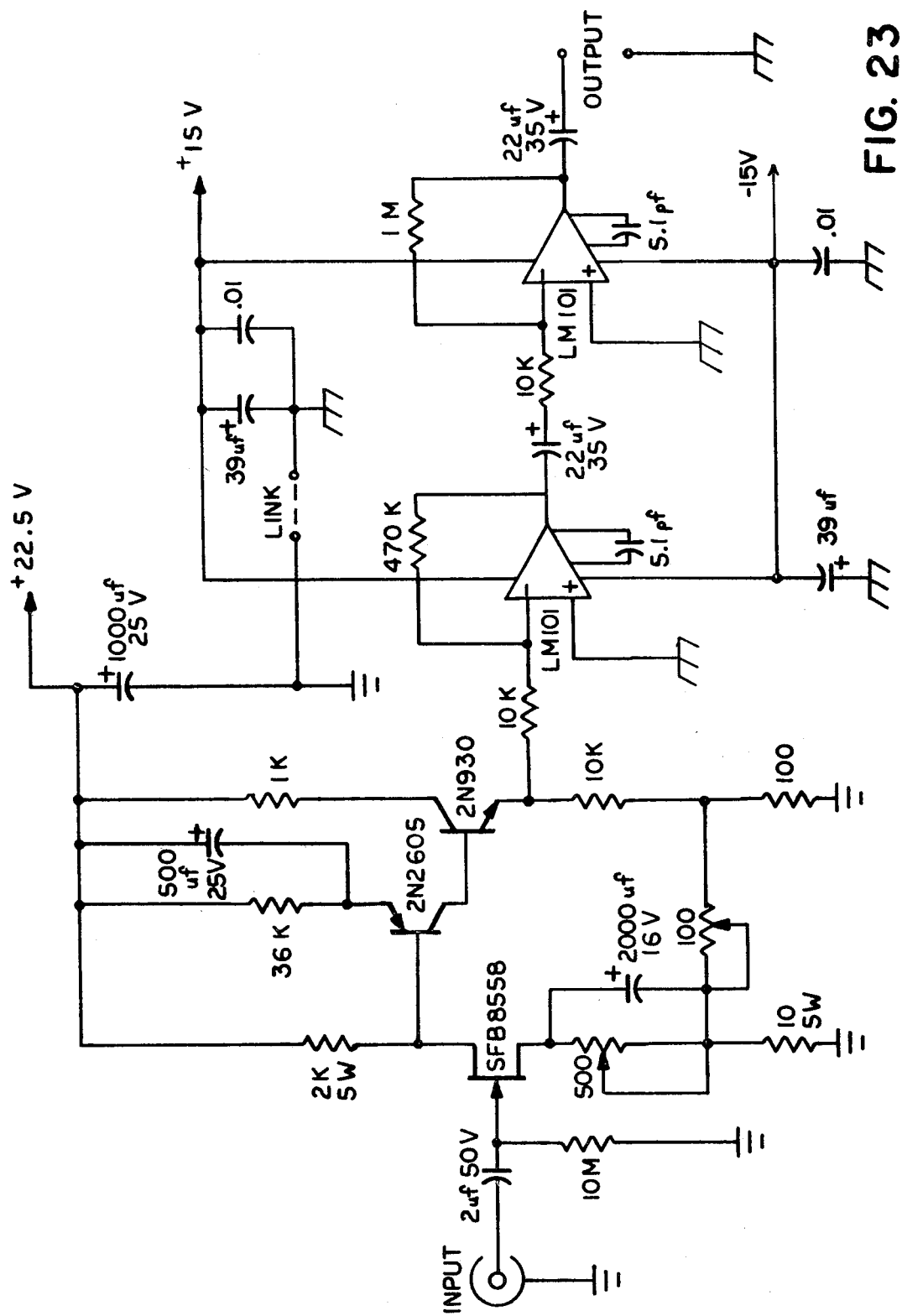
FIG. 23 is an electrical schematic of the preamplifier used in experimental system 3.

To evaluate the operational characteristics of the detector and readout means of the present invention, a model detector as in FIG. 1 was built and mounted on an optical bench which contained a He-Cd laser, collimating lens and field stop. The $C_2$ was formed of approximately 5 mil mylar plastic coated with a few angstroms of gold, i.e., to where the surface resistance of the mylar is equal to 20 ohms per square (layer 20, FIG. 1). The mylar was bonded to the selenium layer with optical cement. The laser was pulsed via a pulse generator. Charge method #2 was used as described above. The detector was loaded with various values of resistances in accordance with the applied voltage. An amplifier with a gain of 1000 was used to condition the detector's output signal prior to display on a storage oscilloscope. A schematic of the amplifier is given in FIG. 23. From photographs taken of the signals on the oscilloscope's screen the total area under the disharge curve was determined via planimeter to estimate the charge set in motion by the laser. This procedure was repeated after exposure to measure exposure to X-ray radiation to determine the number of coulombs of charge discharged by the X-ray exposure.

Experimental Results

Figure 14:
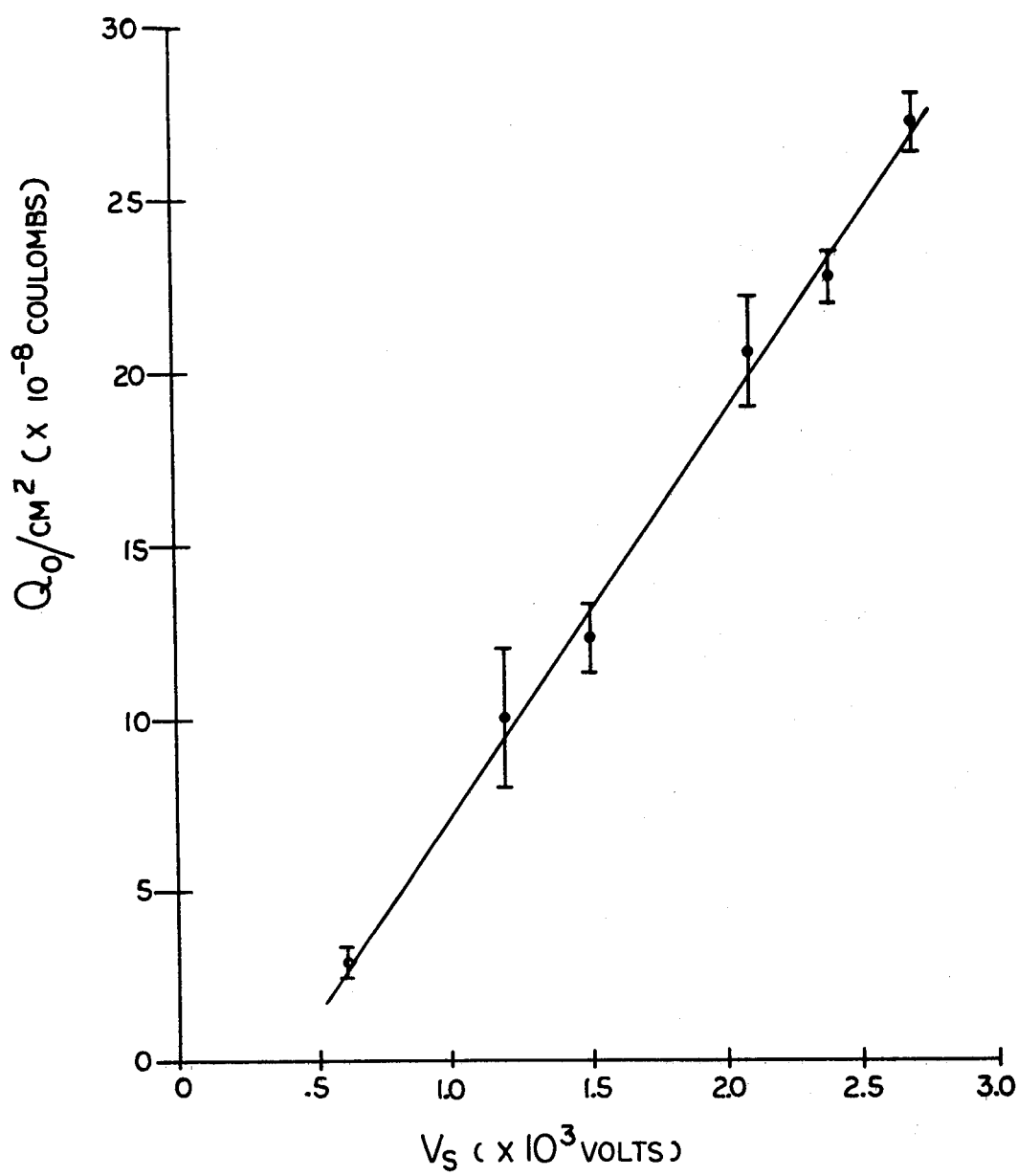
FIG. 14 is a graph illustrating the theoretical maximum charge obtainable from an experimental detector structure per unit area of the detector as a function of the voltage applied across its photoconductive layer.

Experiments were designed to determine if detector and readout means of the present invention performed as predicted. Using Equation (17), the total possible signal, in coulombs per square centimeter, was calculated assuming $Q_X=0$, $C_1=3.69\times10^{-11}$ and $C_2=2.93\times10^{-11}$ farads/cm$^2$. FIG. 14 is a graph of the number of coulombs theoretically predicted by such a model as a function of supply voltage applied across the detector. Also shown on FIG. 14 are several experimentally measured values of charges collected from experimental system #2, which was constructed and tested in the experimental radiology laboratory of M.D. Anderson Hospital in Houston, Tx.

In experimental system #2 the selenium thickness was measured as 150 microns. Five mil mylar was employed as the second dielectric. All charges calculated in FIG. 14 assumed an active area or pixel size of 0.3 cm$^2$ and represent total disharge of the pixel.

As can be seen from FIG. 14, the correlation of calculated and measured charge collected is very good if one assumes a loss of $3.93 \times 10^{-9}$ coulombs. This departure from the theoretically obtained value may be due to incomplete discharge caused by the existence of a blocking contact at the selenium/aluminum interface. The fact that the emperical experimental data does not extrapolate to zero may also imply that as the plate nears total discharge, fewer charges are collected because more recombination takes place at lower field strength.

Figure 15:
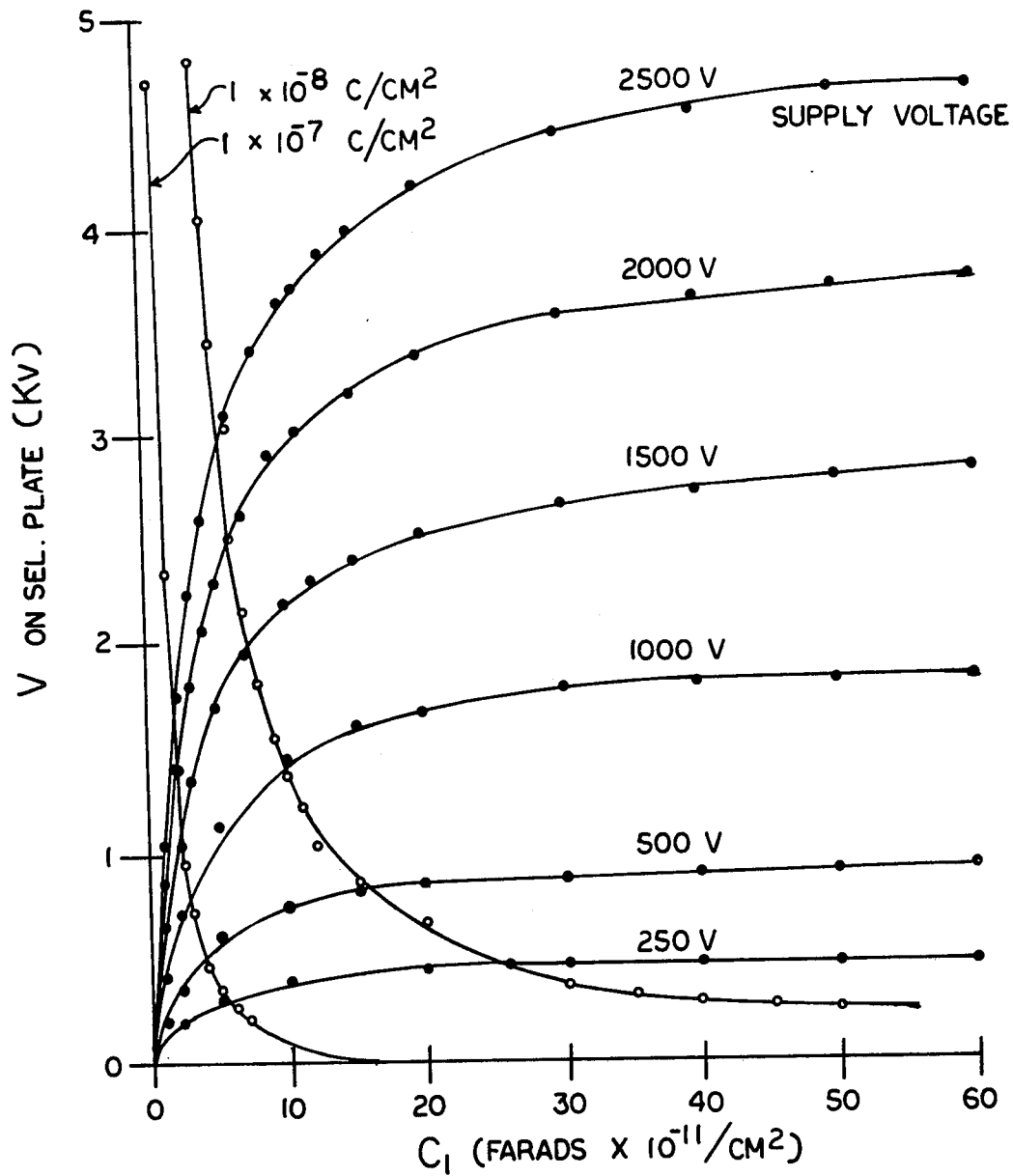
FIG. 15 is a graph illustrating the voltage across the selenium layer of a theoretical detector in kilovolts as a function of the value of C2 in farads, for that detector.

FIG. 15 is a graph illustrating the electric field strength across the selenium layer of the detector as a function of mylar thickness, i.e. $C_2$, for a given selenium thickness and various supply voltages applied by charge method #2. This graph is useful in predicting the dynamic range of the system in coulombs for various combinations of $C_2$ and $V_s$. In experimental system #2, $C_1$ is fixed at $3.69 \times 10^{-11}$ farads/cm$^2$ by the 150 micron thickness of selenium. Referring again to FIG. 15, if $C_2$ is $8 \times 10^{-11}$ farads/cm$^2$ and $V_s$ at 2000 V, we find the voltage applied to the selenium will be 2500 V, using charge method #2, and the dynamic range of the detector will be $1 \times 10^{-7}$ coul/cm$^2$. This means that for each square centimeter of plate illuminated, a total of $1 \times 10^{-7}$ coulombs will flow in the external circuit. X-ray exposure to produce a latent image would decrease this total.

Figure 16:
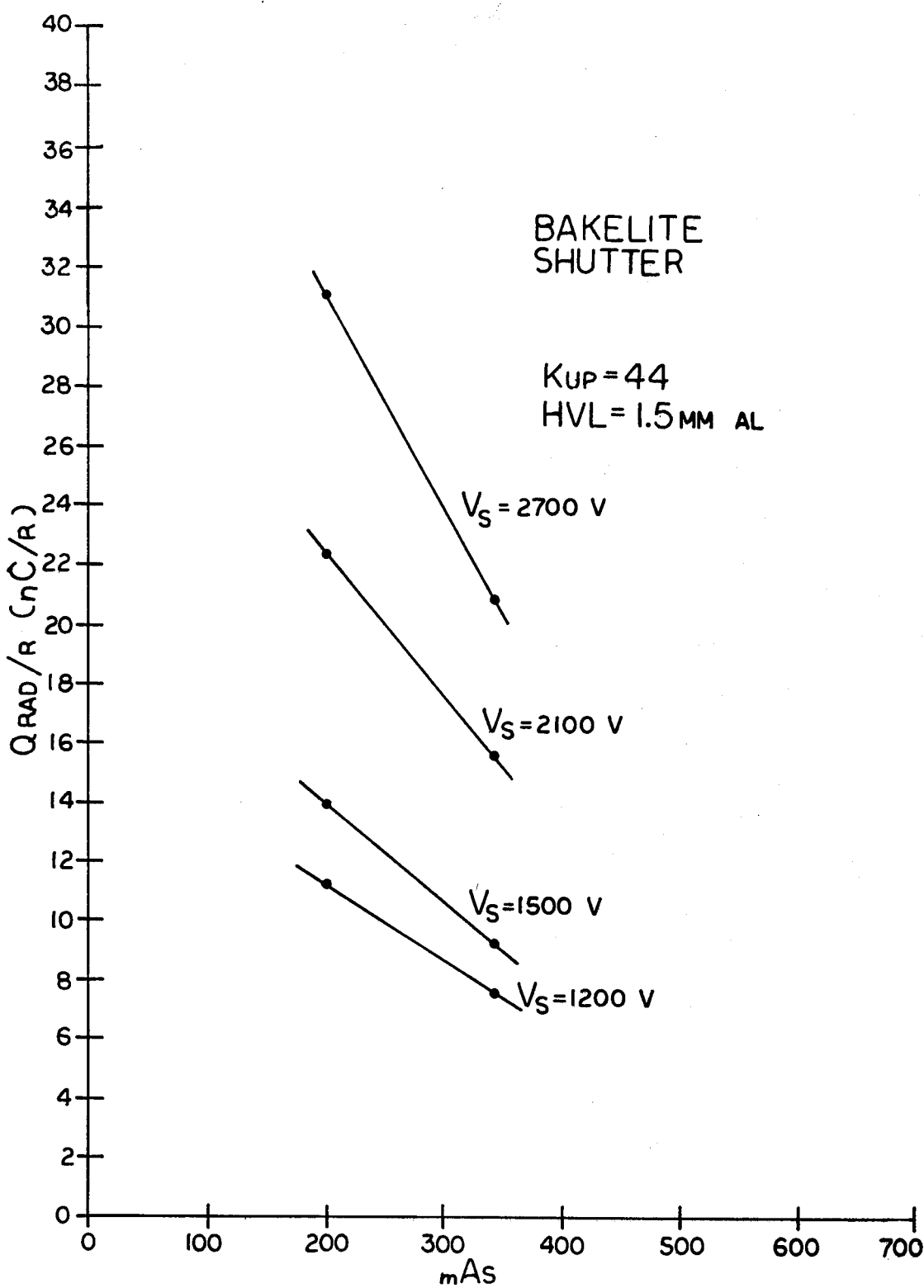
FIG. 16 is a graph illustrating the charge, in coulombs collected by the experimental detector structure per unit of exposure as a function of total exposure. The values plotted in FIG. 16 were obtained using a Bakalite shutter.

The detector's sensitivity to X-ray exposure is of great importance. That is, how many coulombs of charge will be set in motion and collected per absorption of an X-ray photon. FIG. 16 is a graph showing the coulombs of charge collected per roentgen exposure as a function of total exposure (measured in MAS (Milliamperes × seconds) applied to an X-ray tube).

The X-ray system employed with experimental system #2 was a Siemens Mammomat designed for operation with a xeroradiographic system. The X-ray unit was operated at 44 kVp and had a half-value-layer (HVL) of approximately 1.5 mm. of aluminum. The receptor was housed in a cassette made of 1/16th inch PVC and had a Bakelite shutter.

FIG. 16 shows that the sensitivity (Q/roent.) of the present invention is higher for higher applied voltages and that the invention is unexpectedly sensitive to low exposure levels. The present invention's efficiency of collection, expressed in coulombs per roentgen, is much higher at low X-ray exposure levels than at high exposure levels.

Figure 17:
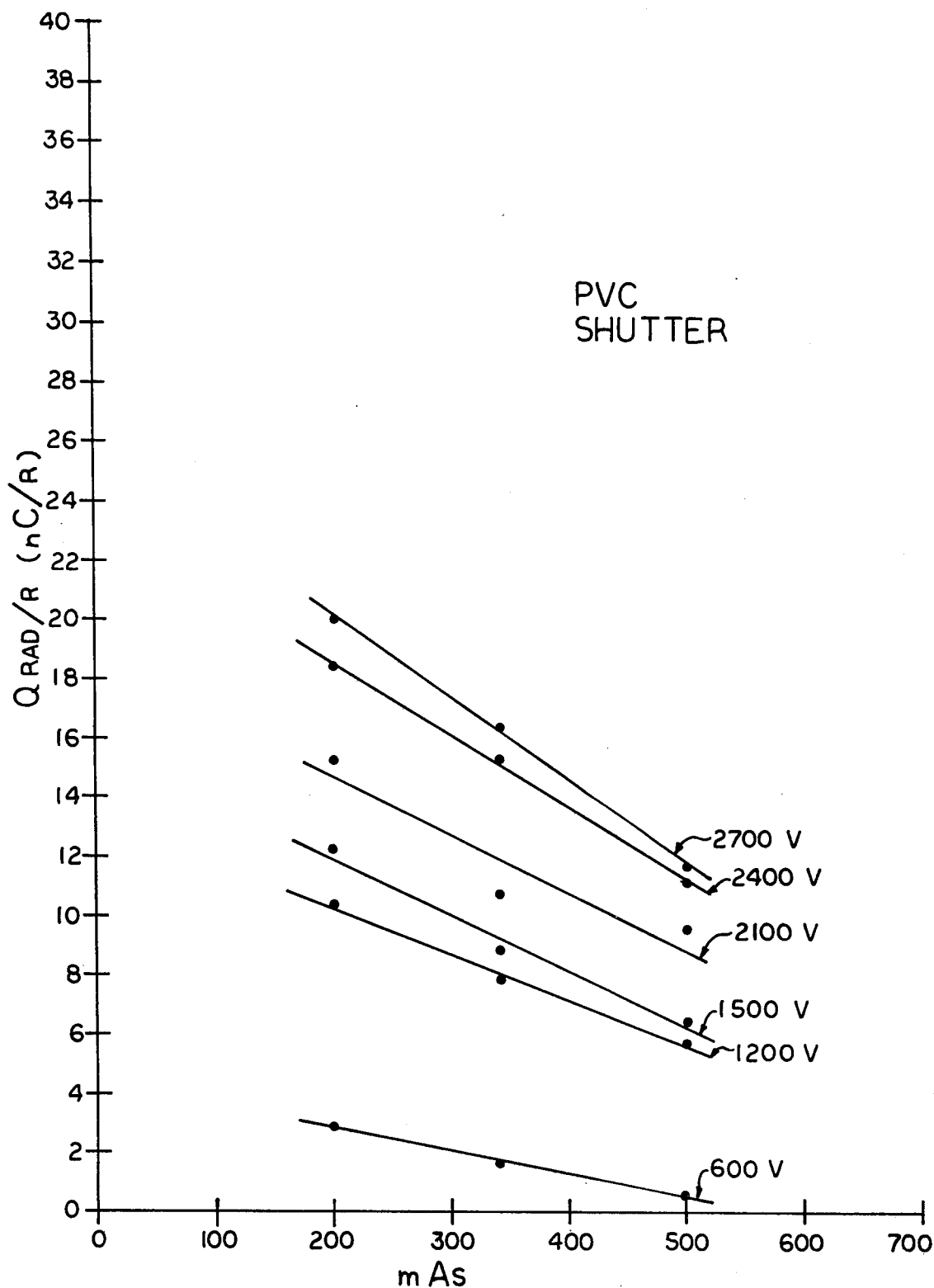
FIG. 17 illustrates the same information as FIG. 16, but the data was obtained using a PVC shutter.

FIG. 17 describes the same data as FIG. 16, however, the X-ray detector cassette is equipped with a 1/16" thick PVC shutter. The high attenuation of PVC to the X-rays employed in these experiments was not appreciated at the time this data was collected.

Figure 18:
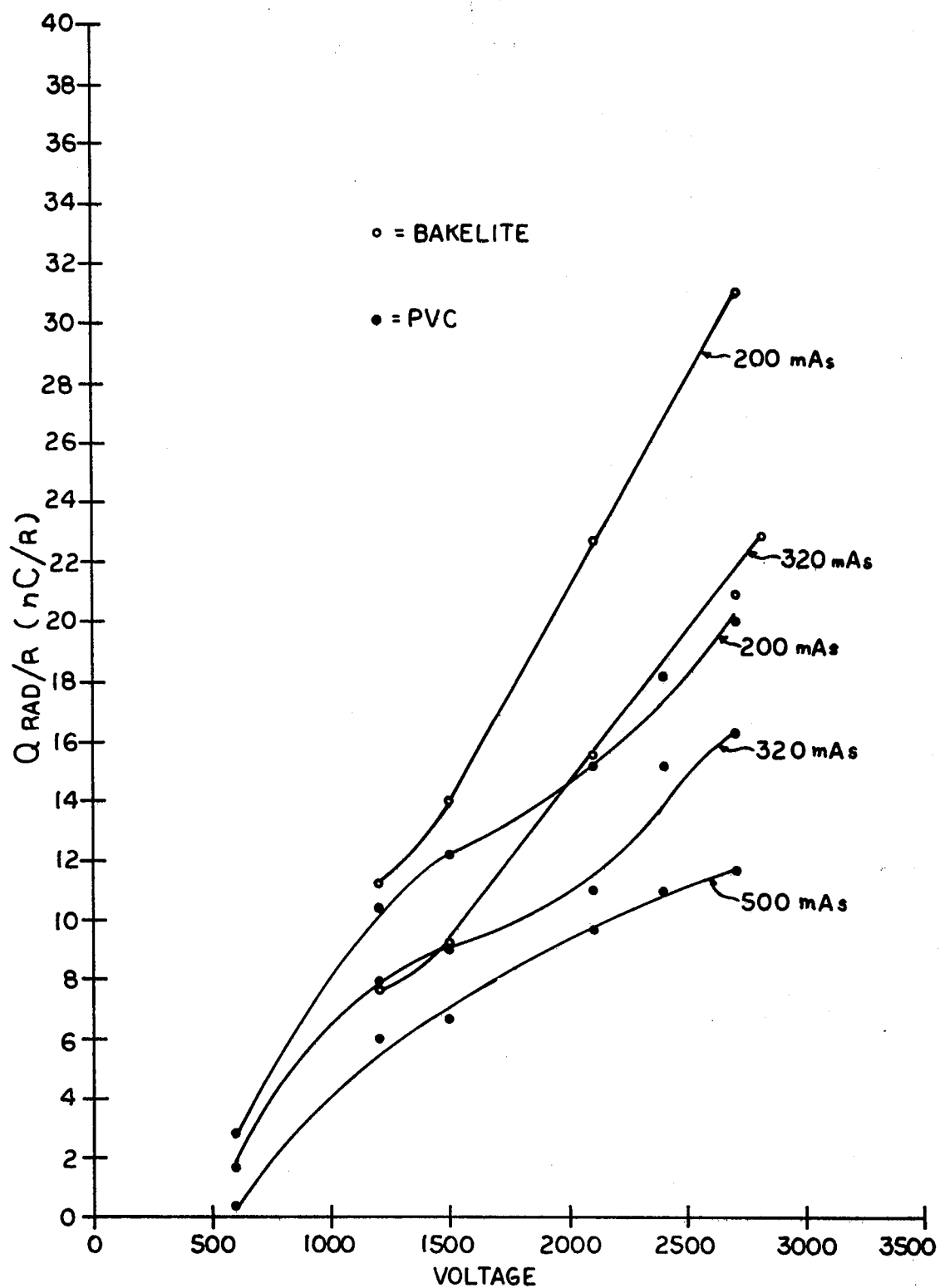
FIG. 18 is a graph showing the efficiency of the present invention, as expressed in coulombs of charge obtained per roentgen of exposure, plotted against supply voltage for various levels of total exposure. This figure illustrates the increased efficiency of the present invention at low radiation levels.

FIG. 18 illustrates the efficiency of the present invention in coulombs/roentgen, as a function of supply voltage. Again the system is clearly more efficient at lower radiation levels. Table IV simply presents the same data in tabular form.

TABLE IV

| SUPPLY VOLTAGE | Q(mc) | 200mAs Bakelite | % | PVC | % | 320mAs Bakelite | % | PVC | % |
|---|---|---|---|---|---|---|---|---|---|
| 600 | .91 ± 0.10 | — | — | .64 nC | 70.3 | — | — | .63 nC | 69 |
| 1200 | 3.11 ± .60 | 2.58 nC | 82.9 | 2.38 nC | 76.5 | 2.80 nC | 90 | 2.88 | 92.6 |
| 1500 | 3.78 ± .30 | 3.20 nC | 84.6 | 2.80 | 74.0 | 3.40 | 89.9 | 3.26 | 86.2 |
| 2100 | 6.32 ± .52 | 5.19 | 82.1 | 3.5 | 55.3 | 5.74 | 90.8 | 4.0 | 63.3 |
| 2400 | 6.98 ± .19 | — | — | 4.2 | 60.2 | — | — | 5.6 | 80.2 |
| 2700 | 8.25 ± .21 | 7.14 | 86.5 | 4.6 | 55.7 | 7.69 | 93.2 | 6.0 | 72.7 |

When a Bakelite shutter is used at 320 MAS and 2700 V supply voltage, 93.2% of all available charges transfer. This represents near total dischage. Further, in view of the variance shown in Table IV in total charges available, the above example does indeed represent total discharges within experimental error.

FIG. 19 illustrates total charge collected as s function of voltage applied across the detector. The curves diverge for the various exposures as the applied voltage is increased. This can be interpreted as meaning that the latitude of the detector, i.e. its ability to differentiate exposures of various levels, increases as applied voltage increases. Optimum latitude can be determined as a trade off between the dynamic range of the system and the signal to noise (S/N) ratio of the detector output signal.

Estimates of the values of $C_1$ and $C_2$ have been made based on calculations of capacitance assuming selenium thickness of 150 microns and a dielectric constant of 6.3; mylar thickness of 4.3 mils and dielectric constant of 3.5. The experimental results allow certain conclusions to be drawn about the present invention:

(1) Use of charge method #2 has allowed use of increased voltage across the selenium while maintaining a lower voltage across the mylar.

(2) For a given thickness of selenium, the dynamic range of the system may be varied by varying the mylar thickness and applied voltage.

(3) The system's dynamic range must necessarily be greater than the range in charges neutralized by radiation absorption, i.e. the x-rays cannot be allowed to completely discharge any part of the detector. This is necessary so as to maintain a field across the selenium even in areas of greatest radiation exposure. Doing so will maintain a good collection efficiency.

It is empirically estimated that any one pixel should not be discharged beyond 50% of its initial charge. This, however, is only an estimate and has yet to be derived theoretically or by optimization procedures.

(4) Using the data collected, an example of the operational characteristics of the system can be computed as follows. Assuming 44 kVp, 320 MAS X-ray source and a 6 cm. lucite phantom, the maximum exposue to the receptor is 370 mR. When operating the invention at 2700 V applied, $6.0 \times 10^{-9}$ coulombs are placed in motion due to irradiating an area of 0.3 cm$^2$. Given a load resistance of 1000Ω and readout time of $4 \times 10^{-6}$ sec. (corresponds to 125,000 hz band width), an amplifier gain of 1000, and a pixel size of 50 micron, the output signal is:

$$E_{out} = \frac{6 \times 10^{-9} \text{ coul/cm}^2 \times 2.5 \times 10^{-5} \text{ cm}^2 \times 1000 \times 1000 \text{ gain}}{4 \times 10^{-6} \text{ sec}}$$

$$= 4.8 \times 10^{-2}$$

$$E_{out} = 48 \text{ mv}$$

System noise may be evaluated as amplifier noise plus Nyquist noise of the input resistance $$E_n = \sqrt{4kTR\ F}\ \Delta$$

$$= \sqrt{4 \times 1.37 \times 10^{-23} \times 300 \times 1000 \times 1.5 \times 10^5} = 1.57 \text{ mv}$$

Using an amplifier with noise figure of 0.8 nano volt/$\sqrt{hz}$ and $1.5 \times 10^5$ hz, $$E_n = .8 \times 10^{-9} (1.5 \times 10^5)^{\frac{1}{2}} = .8 \times 10^{-9} \times 3.87 \times 10^2$$

$$= .309 \text{ mv}$$

hence the amplifier noise is much less than the Nyquist noise of the input resistor. Therefore, signal to noise ratio is:

$$S/N = (48./1.57) = 30.5:1$$

this dynamic range will produce an image with approximately 9–10 shades of gray. Here a shade of gray is defined as $\sqrt{2}$ increase in signal. That is, $$\text{Shades of Gray} = \frac{2 \log S/N}{\log 2}$$

EXPERIMENTAL SYSTEM #3

Figure 20:
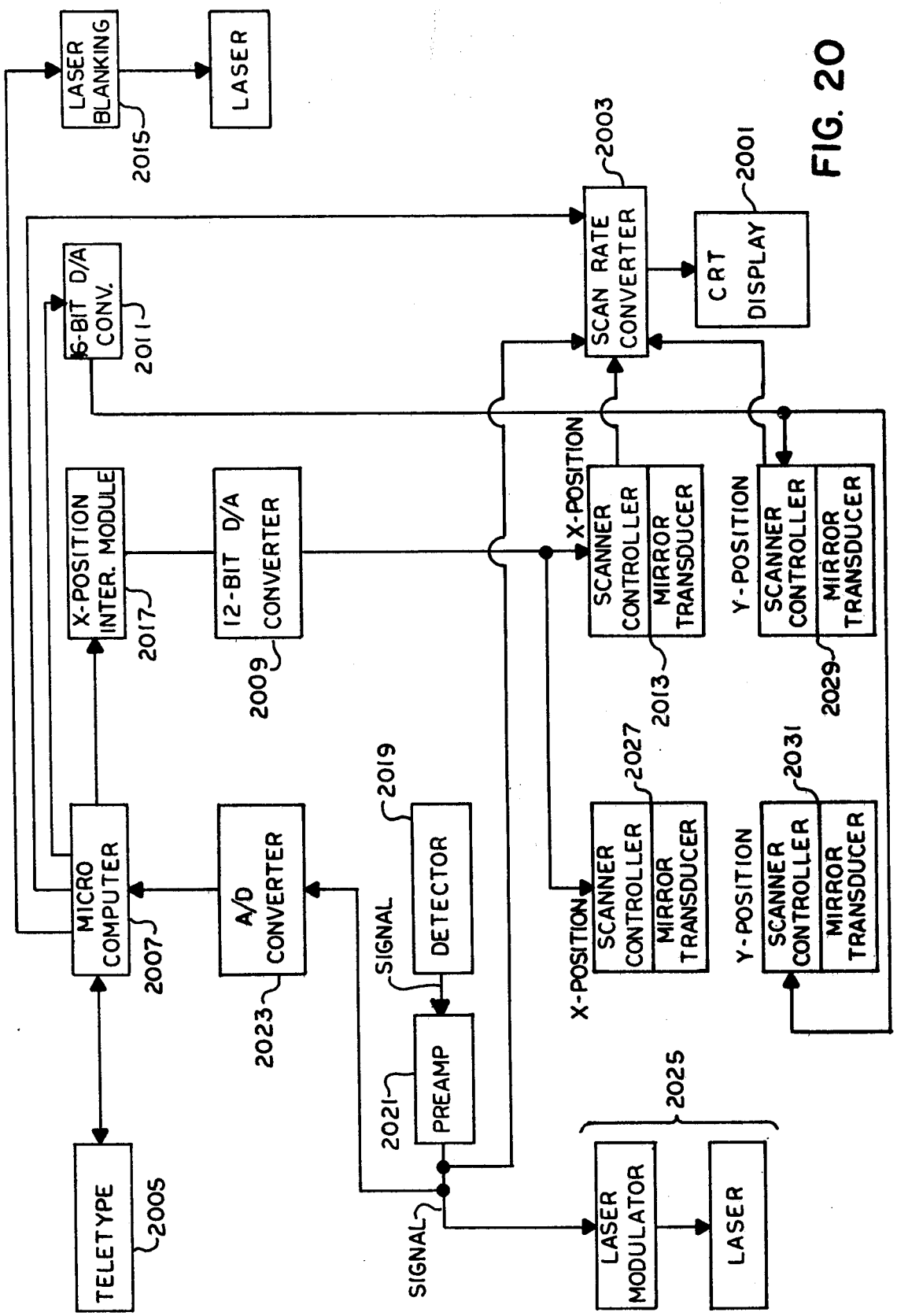
FIG. 20 is a functional block diagram of an experimental prototype system of the present invention.

FIG. 20 is a block diagram that illustrates the major components of the third experimental system built at the experimental radiology department of M.D. Anderson Hospital in Houston, Tx. This experimental system was built to test the entire integrated system of the present invention and to provide a breadboard system for initial clinical evaluation. This system is fully computerized.

As is shown in FIG. 20, microcomputer 2007, which is a Southwest Technical Products 6800, controls laser blanker 2015; 16-bit d/a converter 2011; x-position interface module 2017; 12-bit d/a converter 2009; and teletype 2005. Teletype 2005 is a model 33ASR. Sixteen-bit d/a converter 2011 is an Analog Devices 1136 and 12-bit a d converter 2009 is an Analog Devices 1132. Laser blanking unit and laser 2015 are a Liconix model 4110 helium/cadmium laser.

Laser 2015 is in a light-tight housing, not shown, such as the one functionally illustrated in FIG. 9, above.

The photon beam from laser 2015 scans detector 2019. The output of detector 2019 is connected to the input of preamp 2021. The output of preamp 2021 is connected to scan rate converter 2003; a/d converter 2023; and write laser modulator and laser 2025.

The output of a/d converter 2023 is an input to microcomputer 2007. Teletype 2005 is in two way communication with microcomputer 2007.

It would be appreciated by looking at FIG. 20 that laser 2015 is a read laser adapted to scan detector 2019 and laser 2025 is a write laser adapted to write information out on a film or xerographic plate. This type of system is generally described in connection with FIG. 11, above.

Both the read and write laser beams are controlled by the microcomputer. The output of 12-bit a/d converter 2009 drives read laser x-position scanner, controller and mirror transducer 2013. It also drives write laser x-position scanner, controller and mirror transducer 2027. Similarly, 16-bit d/a converter 2011 drives both read laser y-position scanner, controller and mirror transducer 2029 and write laser y-position scanner, controller and mirror transducer 2031. It will easily be appreciated that the beams from both the read laser and the write laser scan in synchronization, although both of them need not be turned on at the same time or modulated by the same signal.

Functionally, the microprocessor accepts instructions from the teletype. These instructions operate on a computer program. A copy of this program's listing is included with this application for the Examiner's convenience. It is the inventors' request that it be inserted in the record so it will be available to the public as part of the File Wrapper of this application.

When the microprocessor addresses the 16-bit da converter and increments the number stored in it, the y-position mirrors of both lasers are deflected to a certain angle. In experimental system #3 this angle is sufficient to move the spot that is illuminated on detector 2019 50 microns. Thus the y-positioning of the laser beam on the detector occurs in 50 micron increments. The program included with this application allows specification of line sizing on the y-axis to 50, 100, 200 or 400 microns. This translates to a resolution in the image produced by the system of 10, 5, 2.5 and 1.25 line pairs per millimeter.

Figure 24:
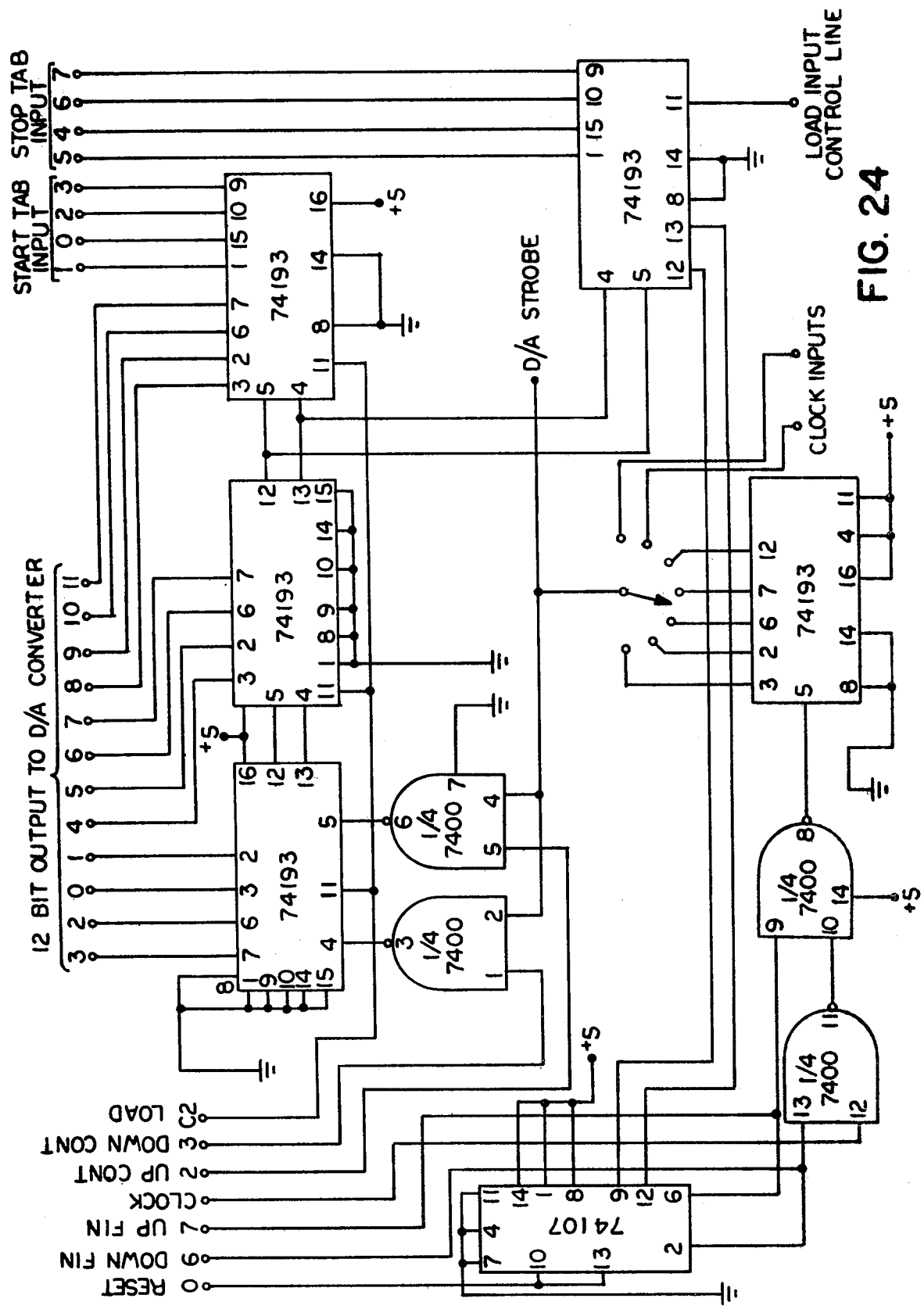
FIG. 24 is a schematic diagram of the X-position interface module used in experimental system 3.

The 12-bit d/a converter is not directly addressed by the computer. The computer addresses a special interface that controls the 12-bit converter. This interface allows the computer to specify the starting and ending positions of the laser beam on the detector surface and along the x-axis. A schematic of x-position interface module 2017 is included as FIG. 24. The computer then issues a start command to the interface which enables a switch selectable clock to start incrementing the d/a to a specific start address. The clock continues to increment the d/a until the stop address is encountered then the clock is disabled by the interface. This x-position interface accomplishes two objectives. First, the data readout range can be varied. Secondly, different size detector plates can be readout without overscanning them. This is especially valuable on an experimental system.

Computer 2007 also controls laser blanking, which just means that it turns the laser on and off. The computer blanks the laser after each x-axis scan is completed. The laser is then moved back across the detector and turned back on for the next scan line.

To readout a plate using experimental system #3:
(1) The user specifies plate size and x-axis line spacing. The computer program will ask for these values.
(2) The x-axis interface is given the appropriate start and stop addresses by the computer.
(3) The x-axis line spacing and total number of required steps is determined by the computer.
(4) The computer blanks the CRT and puts the scan rate converter into the write mode.
(5) The laser is turned on by the computer.

(6) The computer instructs the interface to turn on the clock.

(7) The x-axis mirror sweeps the laser across the plate.

(8) The computer turns off the laser.

(9) The computer increments the y-axis d/a the required number of steps which moves the laser beam through the specified line spacing.

(10) The computer then repeats steps 5-9 until the entire plate has been scanned.

(11) The computer puts the scan rate converter in the read mode and the image is displayed.

The read laser x-position scan controller and y-position scan controller both feed into scan rate converter 2003. The scan rate converter It allows a relatively slow video image, such as that formed by experimental system #3, to be interfaced with a television display. Scan rate converter 2003 outputs a normal video signal to CRT display 2001, where the image may be viewed, moved about on the screen, or expanded to examine detail.

The example and suggested systems illustrated and discussed in this specification are intended only to teach those skilled in the art the best way known to the inventors to make and use their invention. Nothing in this specification should be considered as limiting the scope of the present invention. Many changes could be made by those skilled in the art to produce equivalent systems without departing from the invention. For example it is possible to use a photoconductor other than selenium as part of the detector sandwich. Holographic optics could be used in the scanning system in place of the mechanical system used in the example. It may be desirable to alter the relative thicknesses of the various layers making up the sandwich structure or to provide for different frequency of light beams to readout the radiographic image or to sense different X-ray potentials. The present invention should only be limited by the following claims and their equivalents.

We claim:

1. A method of impressing a uniform surface charge on a multilayered photon detector having sequentially stacked in plane parallel a first conducting layer, a junction layer, a photoconductive layer, an insulating layer, and a transparent conductive layer comprising:

connecting a high electric potential across the first conducting layer and the transparent conductive layer;

storing the detector in the dark;

disconnecting the source of external electric potential while said detector is in the dark;

electrically connecting said first conducting layer to said transparent conducting layer while said detector is in the dark; and reapplying the potential with reversed polarity between said first conducting layer and said transparent conducting layer while said detector is in the dark.

2. A method as in claim 1 including flooding the transparent conductive layer side of the multilayered detector with light while the high potential is connected across the detector.

3. A method as in claim 1 wherein said electric potential is at least 2000 volts.

* * * * *